(12) United States Patent
Roman, Jr. et al.

(10) Patent No.: US 7,427,529 B2
(45) Date of Patent: Sep. 23, 2008

(54) DEPOSITION OF PERMANENT POLYMER STRUCTURES FOR OLED FABRICATION

(75) Inventors: Paul J. Roman, Jr., North Tonawanda, NY (US); Harold O. Madsen, Rio Rancho, NM (US)

(73) Assignee: Simon Fraser University, Burnaby, British Columbia (CA)

( * ) Notice: Subject to any disclaimer, the term of this patent is extended or adjusted under 35 U.S.C. 154(b) by 0 days.

(21) Appl. No.: 10/422,212

(22) Filed: Apr. 23, 2003

(65) Prior Publication Data
US 2004/0101988 A1 May 27, 2004

Related U.S. Application Data

(63) Continuation-in-part of application No. 09/875,115, filed on Jun. 6, 2001, now Pat. No. 6,566,276.

(60) Provisional application No. 60/209,947, filed on Jun. 6, 2000.

(51) Int. Cl.
*H01L 21/00* (2006.01)
(52) U.S. Cl. ....................................................... 438/70
(58) Field of Classification Search .................... 438/70
See application file for complete search history.

(56) References Cited

U.S. PATENT DOCUMENTS

| | | | |
|---|---|---|---|
| 4,343,875 A | 8/1982 | Sickenreuther | |
| 4,439,464 A | 3/1984 | Lauks | |
| 4,770,590 A | 9/1988 | Hugues et al. | |
| 5,140,366 A | 8/1992 | Shiozawa et al. | |
| 5,178,989 A | 1/1993 | Heller et al. | |
| 5,272,099 A | 12/1993 | Chou et al. | |
| 5,292,558 A | 3/1994 | Heller et al. | |
| 5,436,176 A | 7/1995 | Shimizu et al. | |

(Continued)

FOREIGN PATENT DOCUMENTS

DE 20120643 U 3/2002

(Continued)

OTHER PUBLICATIONS

Rajeswaran and Vaeth; *Fundamentals of OLED Displays*; Society for Information Display—Short Course S-4 (2001).

(Continued)

*Primary Examiner*—W. David Coleman
(74) *Attorney, Agent, or Firm*—Morgan, Lewis & Bockius LLP

(57) ABSTRACT

A light emitting display comprising a first electrode layer on a substrate. The electrode layer is patterned to form a plurality of laterally spaced apart strips in a first direction. A plurality of spacedly disposed light emitting organic elements with a second electrode layer atop are disposed on the first electrode layer in a second direction. An undercut structure made of an undercut pattern transfer layer and an overlaying pattern transfer layer. The undercut structure is disposed between the plurality of spacedly disposed light emitting organic elements. A light emitting display having a color isolation well. The color isolation well is characterized by a first well layer and a second well layer in which the first well layer matches a property of an emissive polymer or small molecule dye held by the well whereas the second well layer does not match the property.

30 Claims, 11 Drawing Sheets

U.S. PATENT DOCUMENTS

| | | | |
|---|---|---|---|
| 5,486,176 A | 1/1996 | Hildebrand et al. | |
| 5,534,312 A | 7/1996 | Hill et al. | |
| 5,627,087 A | 5/1997 | Hsu et al. | |
| 5,652,166 A | 7/1997 | Sun et al. | |
| 5,716,758 A | 2/1998 | Bae et al. | |
| 5,766,784 A | 6/1998 | Baskaran et al. | |
| 5,792,274 A | 8/1998 | Tanabe et al. | |
| 5,821,017 A | 10/1998 | Thompson et al. | |
| 5,935,762 A | 8/1999 | Dai et al. | |
| 5,952,037 A | 9/1999 | Nagayama et al. | 427/66 |
| 5,989,759 A | 11/1999 | Ando et al. | |
| 6,013,538 A | 1/2000 | Burrows et al. | |
| 6,048,769 A | 4/2000 | Chau | |
| 6,069,443 A | 5/2000 | Jones et al. | |
| 6,071,676 A | 6/2000 | Thomson et al. | |
| 6,072,207 A | 6/2000 | Yoshimori et al. | |
| 6,107,736 A | 8/2000 | Shi et al. | |
| 6,191,433 B1 | 2/2001 | Roitman et al. | |
| 6,235,693 B1 | 5/2001 | Cheng et al. | |
| 6,248,704 B1 | 6/2001 | Small et al. | |
| 6,297,516 B1 | 10/2001 | Forrest et al. | |
| 6,307,087 B1 | 10/2001 | Buchwald et al. | |
| 6,433,358 B1 | 8/2002 | Beierlein | |
| 6,506,616 B1 | 1/2003 | Kim et al. | |
| 6,548,961 B2 | 4/2003 | Barth et al. | |
| 6,566,276 B2 | 5/2003 | Maloney et al. | 438/758 |
| 2002/0037481 A1 | 3/2002 | Lee et al. | |
| 2002/0076495 A1 | 6/2002 | Maloney et al. | |

FOREIGN PATENT DOCUMENTS

| | | |
|---|---|---|
| EP | 0910128 2 | 4/1999 |

OTHER PUBLICATIONS

White et al; *Use of Photosensitive Polymide for Deep X-ray Lithography*; Appl. Phys. Lett. 66 (16); (1995); pp 2072-2073.

L.B. Geotting et al., 1994 "Photoresist-free lithography of 3μm wide $WO_3$ lines from amorphous films of uranyl complexes" J. Materials Science 29 6147.

R.H. Hill et al., 1996 "Molecular design for photo and elctron beam lithography with thin films of coordinating compounds," Materials Chemistry and Physics 43 233.

A.A. Avey and R.H. Hill, 1996 "Solid State Photochemistry of $Cu_2(OH_2)_2(O_2C(CH_2)_4CH_3)_4$ in Thin Films: The Photochemical Formation of High-Quality Films of Copper and Copper (I) Oxide. Demonstration of a Novel Lithographic Technique for the Patterning of Copper," J. Am. Chem. Soc. 118 1 237.

M. Gao and R.H. Hill, 1998 "High efficiency photoresist-free lithography of $UO_3$ patterns from amorphous films of uranyl complexes," J. Mat. Res. 13 5 1379.

S.L. Blair and R.H. Hill, 1998 "Photochemistry of thin amorphous films of $Fe(CO)_4PPh_3$ on Si(III) surfaces," J. Organometallic Chem. 554 63

International Search Report for International Application No. PC/US2004/012201, International Filing Date Apr. 19, 2004.

DEPOSITION OF PERMANENT POLYMER STRUCTURES FOR OLED FABRICATION

This application is a continuation-in-part of U.S. provisional patent application 60/209,947, which was filed on Jun. 6, 2000. This application is also a continuation-in-part of copending application Ser. No. 09/875,115 to Maloney et al., filed Jun. 6, 2001, now U.S. Pat. No. 6,566,276, which is hereby incorporated by reference in its entirety.

FIELD OF THE INVENTION

The present invention relates to improved organic electroluminescent devices and improved methods for manufacturing organic electroluminescent devices. Organic electroluminescent devices include organic light-emitting diodes and polymer light-emitting diodes. They are used in a number of devices, such as car radios, mobile phones, digital cameras, camcorders, personal digital assistants, and other devices using flexible and non-flexible displays.

BACKGROUND OF THE INVENTION

Over the past two decades, new flat panel display technology based on light emission from thin layers of small organic molecules (organic light-emitting diodes or OLEDs) or conducting polymers (polymer light-emitting diodes or PLEDs) has emerged. As used herein, the term OLED will be used to refer to organic electroluminescent devices, including both small molecule OLEDs as well as PLEDs. Compared to liquid crystal-based displays (LCDs), this technology offers higher contrast displays with lower power consumption, and response times fast enough for video applications. Displays based on OLED technology exhibit a much wider viewing angle than liquid crystal displays (LCDs). OLED technology has the additional advantage over LCD technology in that OLEDs do not require back lighting whereas LCD technology does require back lighting. Currently, more than seventy companies worldwide are developing display technologies based on OLED structures. Sales of displays based on OLEDs, such as car radios, mobile phones, digital cameras, camcorders, personal digital assistants, navigation systems, games, and subnotebook personal computers, are forecast to grow to more than one billion dollars in 2005. See, for example, Society For Information Display, Short Course S-4, *Fundamentals of OLED Displays*, Jun. 3, 2001.

The basic device configuration for OLEDs is a multilayered or sandwich-type structure comprising a substrate, a transparent anode, two or more organic layers with different charge transport or luminescence characteristics, and a metal cathode. The morphology of the organic layers typically ranges from mesomorphous (e.g., semi-crystalline) to amorphous. Unlike inorganic LEDs, there are no lattice matching requirements with OLEDs, which greatly widens the types of substrates that can be used and the types of materials that can be combined together into devices. Use of multiple organic layers in the device geometry facilitates charge injection at the organic-electrode interface, leading to lower driving voltages. In addition, use of multiple organic layers allows the buildup of electrons and holes (and therefore, the location of the emission zone) to occur away from the electrodes, which significantly improves the efficiency of the device.

A typical organic light emitting device 30 in accordance with the prior art is shown in FIG. 1. Organic light emitting device 30 comprises a substrate 32. Substrate 32 can be made from a variety of materials, including but not limited to, glass, quartz, and plastic. Anode 34 overlays substrate 32. A typical material used to make anode 34 is indium tin oxide. A hole transport region 36 composed of a hole transport material (HTM) overlays anode 34, a mixed region 38 comprising a mixture of a hole transport material and an electron transport material overlays hole transport region 36, and an electron transport region 40 composed of an electron transport material (ETM) overlays mixed region 38. A cathode 42 overlays electron transport region 40 and a protective layer 44 overlays cathode 42.

Not all electroluminescent devices have precisely layers 36, 38, and 40. In fact, this is one of the advantages of OLEDs. For convenience, the term "organic layer" is used to refer collectively to layers 36, 38, and 40. Thus, in some structures, the "organic layer" includes discrete layers 36, 38, and 40 whereas in other devices the "organic layer" comprises any number of layers that, collectively, are equivalent to layers 36, 38, and 40 of FIG. 1. For instance, in some instances, five or more layers could, together, form the "organic layer." In mixed layer 38 (FIG. 1), one of the hole transport material and the electron transport material is an emitter. Upon application of an electrical current, the organic electroluminescent device radiates light generated by recombination of electrons and holes in the organic materials used to make layers 36, 38, and 40.

An OLED is a current-driven device. That is, the intensity of the output light is directly proportional to the electrical current flow through the device. An OLED display, therefore, requires the control and modulation of electrical current levels through individual elements (pixels) in order to display text or graphic images. There are two general architectures for addressing pixels in an OLED: passive matrix and active matrix. Referring to FIG. 2, the passive-matrix OLED display is formed by dividing anode layer 34 into columns and cathode layer 42 into rows that intersect the anode columns. In typical implementations, the columns provide the data signal while the rows are addressed one at a time. The current flow through a selected row is typically pulsed to a level that is proportional to a level that is a function of the total number of rows in the display.

Although passive-matrix OLED displays are relatively simple to construct with intersecting anode columns and cathode rows, their fabrication requires patterning the reactive cathode layer 42 without affecting the properties of underlying organic layers (e.g., FIG. 1, layers 36–40). In one known approach, illustrated in FIG. 3, an integrated shadow mask is used to accomplish the task of dividing cathode layer 42 into rows. In the integrated shadow mask method, anode layer 34 and an integrated shadow mask are deposited on substrate 32 and patterned to form undercut pillars 310 using photolithography before the organic layers 36–40 and cathode 42 are deposited. In particular, a positive photoresist that, under certain circumstances, can switch to a negative tone is used to create undercut pillars 310. The effect of undercut pillars 310 is that they isolate the cathode layer 42 in each respective pixel region 302 from neighboring pixel regions. As is illustrated in FIG. 3, each pillar 310 is undercut to insure isolation of respective rows of cathode 42.

While passive-matrix OLED devices find many applications in consumer and industrial products, there is a drawback with such devices. They are not easily fabricated in a manner allowing for consistent device reliability and appropriate yield. Each pillar 310 has an undercut slope profile to avoid the need for angle evaporation and to improve cathode row isolation. The manufacture of such undercut photoresist structures is not reliable using known lithographic techniques. See, for example, U.S. Pat. No. 6,107,736 to Shi et al. In some instances the slope profile of the shadow mask used to make pillars 310 is achieved using a form of positive photoresist that is baked at specific temperatures in order to reverse the resist to a negative photoresist. Each batch of photoresist used in such processes needs to be calibrated in order to identify the temperature at which this conversion from positive resist to negative resist is achieved. Such calibration is time consuming and expensive. Furthermore, the integrated shadow mask method is sensitive to lines and features (e.g., patterned anode 34) because the resist is sensitive to anything that changes the aerial image in the resist. Additionally, the integrated shadow mask method involves several complex steps. In some cases, two exposures are required. The first exposure is a more penetrating exposure that is used to shape the bottom of the shadow mask (e.g., the bottom of pillar 310). Then, the second exposure is less penetrating and is used to shape the top of the shadow mask. In some instances, the shadow mask is patterned in a single exposure. Yet another drawback with the integrated shadow mask method is that the method results in an increase in the crosstalk associated with device leakage between the anode 34 and the cathode 42. The leakage is mainly caused by the poor surface coverage of organic electroluminescent medium at the edge between the shadow mask (310) and anode 34. See, for example, U.S. Pat. No. 6,107,736 to Shi et al.

One of the drawbacks in the manufacture of passive matrix OLEDs has been discussed. Another hurdle in the manufacture of OLEDs arises in the case where the OLED based display is a color display. In such instances, each pixel in the color display is represented by three different colors, which approximate the three primary colors, red, green, and blue. For proper operation of the color display, each color in each pixel needs to be isolated from the other colors.

A schematic of a typical active matrix OLED color display in accordance with the prior art is illustrated in FIG. 4. There are thin film transistors 402 embedded in a substrate 32. Anode layer 34 overlays substrate 32. Emissive layer 410 (the organic layer) in the OLED color display is separated into discrete color isolation wells. Each color isolation well is filled with a predetermined emissive polymer or small molecule dye. Representative polymers include, but are not limited to, poly(phenylene vinylene) derivatives (Cambridge Display Technology, Cambridge England) and poly(fluorene) derivatives (Dow Chemical, Midland, Mich.). A barrier 420 is used to shape the boundaries of each color isolation well. Typically, an isolation barrier 430 is overlayed on top of each barrier 420. Barrier 420 is typically made out of a material such as $SiO_2$. Isolation barrier 430 is typically made out of photoresist such as a poly(methyl methacrylate) (PMMA) or polyimide. One representative polyimide that can be used to form isolation barrier 430 is Dupont Pyralin 2411 photosensitive polyimide. See, for example, White et al., 1995, Appl. Phys. Lett. 66, p. 2072; and Pottiger, *Proceedings of the 38th Electronic Components Conference*, presented at the IEEE Conference, Los Angeles, Calif. (IEEE, New York, 1988), p. 315. Finally, cathode 42 is overlayed on the device to complete the color based active matrix OLED.

A major hurdle in the fabrication of OLED color displays is the population of the color isolation wells with polymer or small molecule dye. Typically, such polymers or small molecule dyes are deposited using techniques such as ink jet printing. However, there are two setbacks associated with this process, containment and wetability. Containment issues involve the need to precisely deposit each dye in the correct color isolation well. Wetability issues relate to the need to match the properties of the color isolation well with the properties of the polymer or small molecule dye so that the dye coats the bottom of the well in a uniform manner. If the surface properties (e.g., hydrophobicity) of the color isolation well do not match the surface properties of the polymer or small molecule, then the dye will bead up within the color isolation well, resulting in unfavorable optical properties in the color display. If wetability is optimized, then the dye will more uniformly coat the color isolation well. Containment depends upon the ability to first deposit the right ink into the right color isolation well and second to trap the ink in the well.

Currently, wetability and containment issues are addressed using a positive slope 460 (FIG. 4) in isolation barrier 430 in order to trap polymer in the color isolation well. Further, various surface treatments are used to control the surface properties of structures 430 to assure adequate wetting of the surface by the light emitting polymer. However, as mentioned above, isolation barrier 430 is made out of patterned photoresist such as PPI or PMMA. Such photoresists are known to have unfavorable wetability properties. As a result, the dye will often bead up or more dye is required in order to get an adequately uniform layer of dye in the color isolation well. Attempts have been made to improve the wetability properties of isolation barriers 430 that have been fabricated by patterning photoresist. For example, attempts have been made to reformulate the photoresist and/or plasma treat the photoresist. Such efforts have generally been unsatisfactory. Accordingly, there is a need in the art for improved color isolation wells in color display OLEDs.

In instances where the OLED is a passive matrix color display, both undercut pillars 310 (FIG. 3) and color isolation wells (FIG. 4) are needed. In instances where the display is an active matrix color display, only color isolation wells (FIG. 4) are needed.

Given the above background, it is clear that improved undercut pillars 310 and methods for manufacturing such structures are needed in order to isolate cathode rows in passive matrix OLEDs. Further it is clear that improved isolation barriers 430 and methods for manufacturing such barriers are needed in order to address the problems of wetability and containment in color based OLED displays.

SUMMARY OF THE INVENTION

The present invention addresses the problems with known OLED manufacturing techniques, resulting in improved OLED based displays. In particular, the present invention uses a photo-resist free method for making patterned films of metal oxides, metals, or other metal containing compounds in order to manufacture undercut pillars 310 as well as isolation barriers 430. The methods of the present invention result in pillars 310 in passive display OLED displays having an improved undercut. This allows for the patterning of higher density pixels, thereby improving display resolution. The methods of the present invention also allow for the flexibility to use materials to build isolation barriers 430 in color based OLED displays that match the properties of the dyes used in such devices, thereby addressing problems with containment and wetability.

The present invention makes use of the novel hard mask fabrication techniques disclosed in U.S. patent application Ser. No. 09/875,115 to Maloney et al., published as US 2002/0076495. The technology disclosed in Maloney et al allows for the creation of a hard mask without the numerous lithographic steps that are conventionally required to make a hard mask. Maloney et al. describes how a hard mask is formed form a precursor comprising a metal complex. The metal complex comprises at least one ligand (e.g., carboxylato, alkoxy, azide, etc.) and at least one metal (e.g., Li, Al, Si, Ti, etc.).

One embodiment of the present invention is used to make a self aligned color isolation well. In this embodiment of the invention, the self aligned structure is fabricated by patterning a hard mask for a desired layer and overcoating with the next layer. After deposition and lithographic definition of the hard masks, a reactive ion etch (RIE), the pattern-transfer from the hard mask, of all of the layers can be completed in a single process step. Attempting to perform the pattern-transfer for each step individually would be very difficult due primarily to lack of planarity of the structure resulting in alignment and depth-of-focus problems.

One embodiment of the present invention provides a light emitting display. The light emitting display has a transparent substrate. A first layer of transparent electrically conductive material is disposed on the transparent substrate forming a plurality of laterally spaced apart strips having a first direction. A plurality of spacedly disposed light emitting organic elements with a second layer of electrically conductive material atop are disposed on the first layer of transparent electrically conductive material in a second direction. The first direction intersects said second direction. An undercut structure comprised of a first pattern transfer layer and a second pattern transfer layer is disposed between the plurality of spacedly disposed light emitting organic elements. The second pattern transfer layer is overlayed on the first pattern transfer layer. The first pattern transfer layer is undercut relative to the second pattern transfer layer in the undercut structure.

Another embodiment of the present invention provides a method of manufacturing a light emitting display having a transparent substrate. A first layer of transparent electrically conductive material is disposed on the transparent substrate forming a plurality of laterally spaced apart strips having a first direction. In the method, a first pattern transfer layer is deposited on the laterally spaced apart strips and on exposed portions of the surface of the transparent substrate. A second pattern transfer layer is deposited on the first pattern transfer layer. A precursor layer is formed atop the second pattern transfer layer. At least a portion of the precursor layer is converted. The precursor layer is developed thereby forming a pattern in the precursor layer. The pattern in the precursor layer is transferred to the first pattern transfer layer and the second pattern transfer layer thereby exposing a portion of the transparent substrate. The first pattern transfer layer is etched so that it undercuts the second pattern transfer layer. One or more organic materials on the second pattern transfer layer and the exposed portion of the transparent substrate are deposited. Then, an upper layer of electrically conductive material is deposited on the one or more organic materials, thereby forming a plurality of spacedly disposed light emitting organic elements with the upper layer of electrically conductive material atop. The light emitting organic elements are disposed in a second direction on the first layer of transparent electrically conductive material. Here, the first direction intersects the second direction.

Another aspect of the invention provides a light emitting display comprising a color isolation well for holding an emissive polymer or small molecule dye. The color isolation well overlays a transparent substrate. The color isolation well comprises a first well layer disposed on the surface of the transparent substrate. The first well layer forms a first well region wherein the surface of the transparent substrate is exposed to an interior portion of the first well region. The color isolation well further comprises a first patterned layer disposed on the first well layer and a second well layer disposed on the first patterned layer. The second well layer forms a second well region that is in fluid communication with the first well region.

Yet another aspect of the invention provides a method of manufacturing a color isolation well for a light emitting display having a transparent substrate with a surface. In the method a first well layer is disposed on the surface of the transparent substrate. A first precursor layer is formed atop the first well layer. At least a portion of the first precursor layer is converted and then the first precursor layer is developed thereby forming a first pattern in the first precursor layer. The first pattern exposes a portion of the first well layer.

A second well layer is disposed on the first precursor layer and the portion of the first well layer that is exposed by the first pattern. A second precursor layer is formed atop the second well layer. At least a portion of the second precursor layer is converted and then the second precursor layer is developed thereby forming a second pattern in the second precursor layer. The second pattern exposes a portion of said second well layer The second pattern in the second precursor layer is transferred to the second well layer and the first pattern in the first precursor layer is transferred to the first well layer thereby forming the color isolation well.

BRIEF DESCRIPTION OF THE DRAWINGS

Additional objects and features of the invention will be more readily apparent from the following detailed description and appended claims when taken in conjunction with the drawings, in which:

Like reference numerals refer to corresponding parts throughout the several views of the drawings.

DESCRIPTION OF THE PREFERRED EMBODIMENTS

The present invention provides permanent polymer structures useful in OLED displays. The present invention further provides methods for making such structures. Section I, below, is directed to undercut pillars (and methods of manufacture thereof) useful for isolating cathode strips in a passive matrix display. Section II, below, is directed to color isolation wells (and methods of manufacture thereof) that are used to contain predetermined emissive polymers or small molecule dyes. Section III, below, is directed to novel photochemical metal organic mixtures that are used to form hard masks without conventional lithographic steps. Finally, Section IV, below, provides exemplary process steps in accordance with the present invention.

I. Manufacture of Passive Matrix OLED Displays

The manufacture of a passive matrix OLED in accordance with a preferred embodiment of the present invention is illustrated in FIG. 5 and described in the following steps.

Step A—selection of a substrate. The organic electroluminescent device is fabricated on a substrate 32 having a surface 550 such as that illustrated in 5A. Hence, the first step in the fabrication process is to provide a substrate upon which the organic electroluminescent device may be fabricated. In some embodiments, substrate 32 is a transparent non-electrically conductive material that serves as a supportive element. Substrate 32 can be fabricated using any of a number of known materials employed in the art including, but not limited to glass quartz and plastic. For example, the substrate 32 can be fabricated of a glass such as Coming 7059 glass, transparent plastic substrates made of polyolefins, polyethersulfones, polyarylates, and combinations thereof. In some embodiments, substrate 32 is made of polyimide, polyeretherketone (PEEK), polyethersulphone (PES), polyetherimide (PEI), polyethylenenapthalate (PEN), or polyester.

Figure 2:
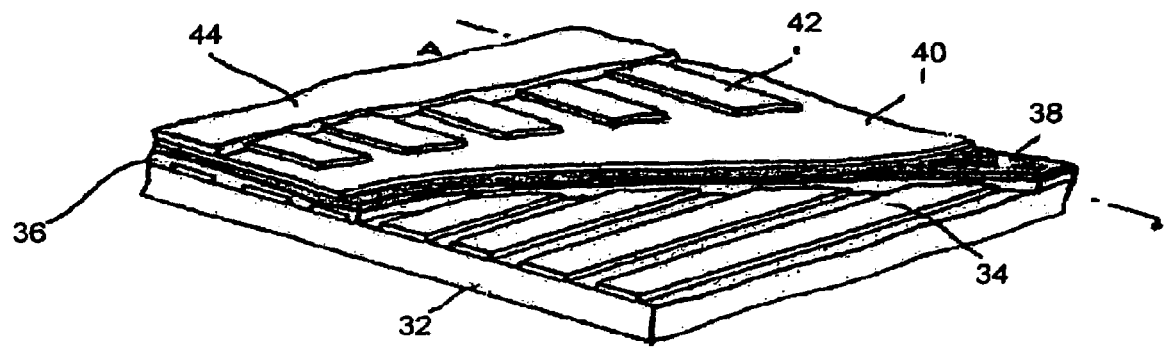
FIG. 2 illustrates a passive matrix OLED in accordance with the prior art.
Figure 5A:
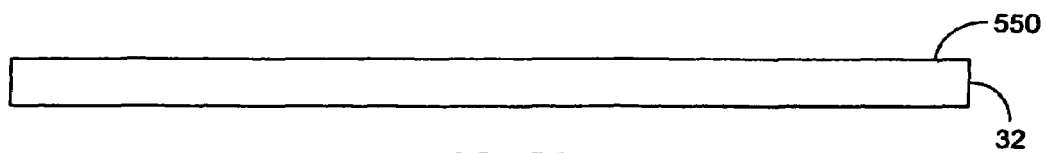
FIGS. 5A–5K illustrate various processing steps in the manufacture of passive matrix OLEDs in accordance with an embodiment of the present invention.
Figure 5B:
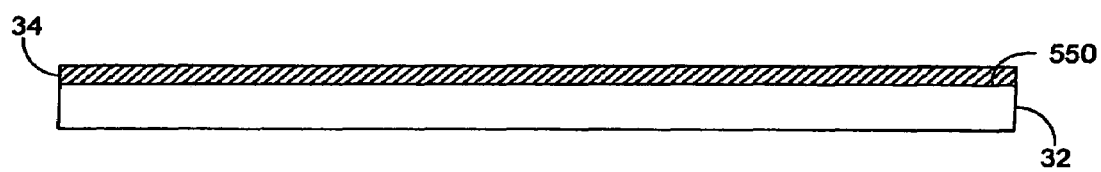

Step B—deposition of the lower electrode. Referring to FIG. 5B, in step B, there is deposited atop surface 550 of substrate 32, a layer of a first electrode material 34 which is electrically conductive and preferably optically transparent or at least semi-transparent. Several materials can be advantageously employed as the first electrode for a passive matrix OLED device. Examples of such materials include conductive metal oxides such as indium oxide, indium tin oxide (ITO), zinc oxide, zinc tin oxide, conductive transparent polymers such as polyaniline and combinations thereof. Alternatively, electrode 34 can be fabricated of a semi-transparent metal, examples of which include a thin layer (e.g., on the order of less than 500 Angstroms) of gold, copper, silver, and combinations thereof. In one preferred embodiment, electrode 34 is fabricated of either ITO or zinc oxide. It should be understood that first electrode layer 34 is patterned to allow for X-Y addressing of the device as previously described in conjunction with FIG. 2 and as described, for example, in U.S. Pat. No. 6,107,736.

Figure 5C:
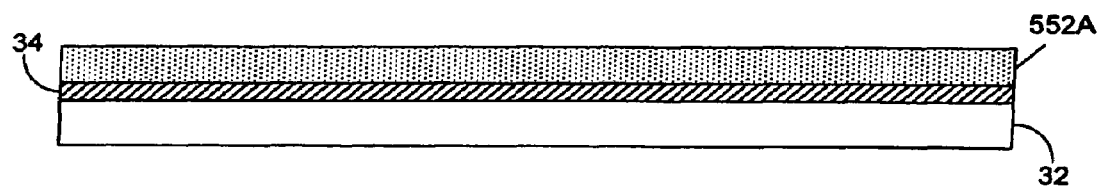

Step C—deposition of a first pattern transfer layer. Referring now to FIG. 5C, illustrated is the inclusion of a first pattern transfer layer 552A overlayed on first electrode layer 34 and exposed portions of substrate 32. Once patterned, pattern transfer layer 552A will serve to automatically pattern organic layers and the upper electrode layer 42 positioned thereupon. In some embodiments, first pattern transfer layer 552A is coated onto anode 34 and exposed portions of substrate 32 using a coating process. There are many possible coating processes, including but not limited to coating via slot die, reverse slot die (where the substrate slides against the coating die on one or more lubricating layers of fluid), fountain, roll (gravure, microgravure, reverse, forward, deformable, porous and combinations thereof), spray, screen, rotating screen, rod, dip, meniscus, curtain, slide, hydropneumatic, knife or comma, squeegee, ink jet, etc. Also useful for coating first pattern transfer layer 552A are printing techniques utilizing anodized, coated, patterned or relieved rolls, plates, or other surfaces. It will be further appreciated by one of skill in the art that various methods could be utilized to increase the process yields and operating ranges of these techniques, e.g., utilization of vacuum, directed jets of gas, ultrasonic energy, electric fields or other electrostatic forces, etc. If the coating is performed on discrete pieces of substrate 32 then other coating techniques can also be considered, e.g., spin coating. See, for example, Madou 2002, *Fundamentals of Microfabrication—The Science of Miniaturization*, Second Edition, CRC Press, Boca Raton, Fla., pp. 159 and 336; and U.S. patent application Ser. No. 09/875,115 to Maloney et al., published as US 2002/0076495.

In a preferred embodiment, first pattern layer 552A is spin coated using a CEE Model 100 CV spin coater (Brewer Science, Inc., Rolla, Mo.) at 5000 rpm, for a period of time (e.g., 20 seconds). In some embodiments, first pattern layer 552 is baked for a period of time (e.g., one minute) prior to subsequent processing steps.

Generally speaking, first pattern layer 552A is made out of any polymer that is soluble in an aqueous solution provided that (i) the solubilized polymer does not dissolve a second pattern layer 552B (discussed below) that is overlayed onto first pattern layer 552A and (ii) the resulting first pattern layer 552A is amendable to etching at a rate that is much faster than the rate at which the second pattern layer 552B can be etched. In some embodiments, layer 552A can be etched at a rate that is five times faster than layer 552B. In more preferred embodiments, layer 552A can be etched at a rate that is ten times faster than layer 552B, twenty times faster than layer 552B, 100 times faster than layer 552B, 1000 times faster than layer 552B, or more than 1000 times faster than layer 552B. Accordingly, the exact types of polymers that can be used in the present invention depend on the type of material used to form layer 552B. Nevertheless, it has been determined that lift-off layer (LOL) and LOR polyimides are specific examples of compositions that can be used to make first pattern layer 552B. Representative LOL and LOR polyimides are sold by a number of commercial vendors including Microlithography Chemical Corporation (Watertown, Mass.) and MicroChem (Newton, Mass.). Representative LOR polyimides include, but are not limited to MCC XP-LOR-1A (Microlithography Chemical Corporation) and polydimethylglutarimide based lift-off resists distributed by Microchem. Polyimides are generally discussed in, for example, Skidmore, *Semiconductor International*, April 1998, p. 116, U.S. Pat. No. 4,923,421 to Brodie, et al.; Frazier and Allen, 1993, J. Microelectromech. Syst. 2, pp. 87–94, which are hereby incorporated by reference in their entireties. In one specific embodiment, first pattern layer 552A comprises a LOL or LOR polyimide that is spin coated onto a silicon substrate 32 using a CEE Model 100 CV spin coater at 5000 rpm for a period of twenty seconds. Then, the polyimide is baked on a hotplate at 230° C. for a period of five minutes.

Figure 5D:
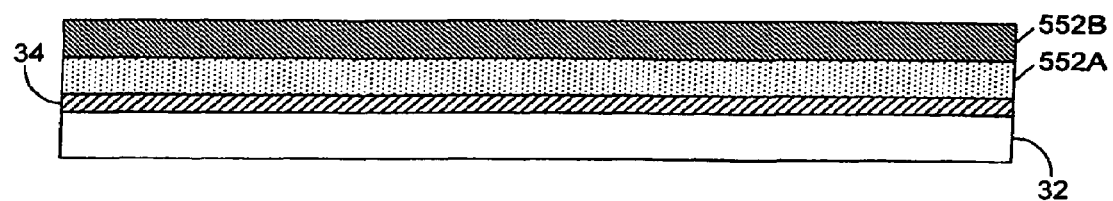

Step D—deposition of a second pattern transfer layer. Referring now to FIG. 5D, a second pattern transfer layer 552B is deposited over the first pattern transfer layer 552B. Typically layers 552A and 552B are made from materials that have different etch properties. For example in some embodiments, first pattern transfer layer 552A comprises polyimide whereas second pattern transfer layer 552B comprises the positive photoresist OFPR800-20 (Tokyo Ohka Kogyo) Az5214E (Hoechst-Celanese), or AZP4620 (Hoechst-Celanese). In some embodiments, second pattern transfer layer 552B is made from an acrylic type resin, a styrene type resin, a novolac resin, a polyolefin type resin, or Epson SU-8 (Shell Chemical). Novolac is discussed in, for example, Lochel et al., 1994, *Electrochemical Microfabrication II*, Miami Beach Fla., pp. 100–111; Lochel et al., 1996, J. Electrochem. Soc. 143, pp. 237–244; and Lochel et al., 1996, *PIE-Micromachining and Microfabrication Process Technol-*

*ogy II*, Austin, Tex., pp. 174–181, which are hereby incorporated by reference in their entireties. For more information on such polymers see, for example, U.S. Pat. No. 6,537,736 to Kishimura et al., which is hereby incorporated by reference in its entirety. Epson SU-8 is an epoxy-based, onium sensitive, UV transparent negative photoresist that can be used to produce high-aspect ratio (>10:1) structures. See, for example, Acosta et al., 1995, J. Electrochem Soc. 95–2, pp. 494–95.

The second pattern transfer layer 552B can be deposited using any of the methods disclosed in step C, above. In some embodiments, second pattern transfer layer 552B is baked for a period of time prior to subsequent processing steps.

In one specific embodiment, second pattern transfer layer 552B comprises the photoresist OFPR800-20 (Tokyo Ohka Kogyo). In this embodiment, OFPR800-20 is spin coated with a CEE Model 100CV spin coater at 5000 rpm for twenty seconds in order to form second pattern transfer layer 552B. Then, the resist is baked at a temperature of 230° C. for a period of one minute.

Step E—deposition of a precursor layer. In the prior art, there is only a single pattern transfer layer. This pattern transfer layer is typically made of photoresist that is patterned by conventional photolithography or similar techniques. Photoresist is used because it can be photo-patterned. This, however, limits the choice of materials for pattern transfer layer 552 to those associated with polymers used in photoresist formulations. Advantageously, in the present invention, pattern transfer layers 552A and 552B are patterned using a novel materials deposition process. Because this novel materials deposition process is used, there is no requirement that pattern transfer layers 552A and 552B be made out of photoresist. However, pattern transfer layers 552A and 552B must have different etching properties so that layer 552A can be selectively etched relative to layer 552B (e.g., 552A is etched at a faster rate than 552B).

Figure 5E:
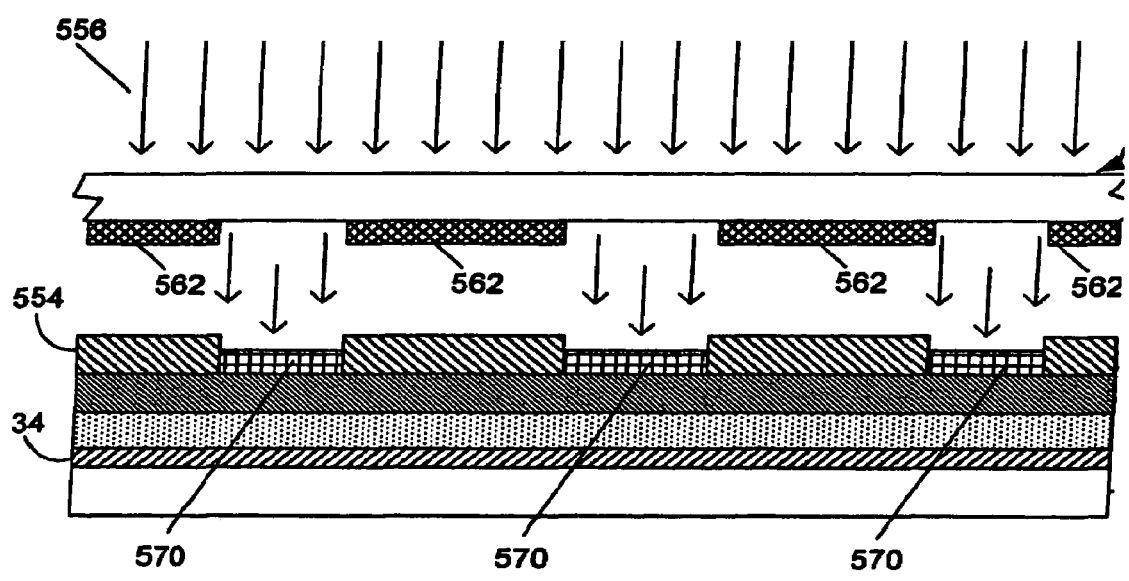

Referring to FIG. 5E, a novel layer of precursor 554 is formed directly over pattern transfer layer 552B. Precursor 554 comprises a metal complex. A wide variety of metal complexes of the formula $M_aL_b$ comprising at least one metal ("M"), e.g., a is an integer which is at least 1, and at least one suitable ligand ("L") or ligands, e.g., b is an integer which is at least 1, can be used to form precursor 554. If a plurality of metals are used, all of the metal atoms can be identical, all can be different atoms and/or have different valences, e.g., Ba Na or Fe(II) Fe(III), or some can be identical while others can be different atoms and/or have different valences, e.g., $Ba_2$ Fe(II) Fe(III). In any case, metal M can be an alkali or alkaline earth, for example Ba or Li, a transition metal, for example Cr or Ni, a main group metal, for example Al or Sn, or an actinide, for example U or Th. Preferably, each metal is independently selected from Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, fr, Pt, Au, Pb, Th, U, Sb, As, Ce, and Mg.

If a plurality of ligands are used in precursor 554, all of the ligands can be identical, all can be different, or some can be identical while others can be different. In any case, ligand L is chosen so that a substantially unconverted precursor complex can be formed and has the properties that (i) it can be deposited in an amorphous film on a substrate, (ii) the amorphous film is stable or, at least, metastable, (iii) upon absorbing energy, e.g., a photon of the required energy, the film can be transformed into a different metal-containing material through a chemical reaction, and (iv) any byproducts of the energy-induced chemical reaction are be removable, e.g., are sufficiently volatile so as to be removable from the film.

To achieve the first two of these results, the complex used to form precursor 554 should have a low polarity and low intermolecular forces. As organic groups usually have low intermolecular forces, ligands having organic groups at their outer peripheries tend to be satisfactory with respect to the first two requirements. If the energy absorbed is light, the chemical reaction used to transform the material is known as a photo-induced reaction.

The deposited film of substantially unconverted precursor 554 is amorphous or at least substantially amorphous. Therefore, to make the metal complex resistant to crystallization, ligand(s) L preferably are such that the complex is asymmetric. The complex can be made asymmetric by using a ligand which itself has two or more stereoisomeric forms. For example, if L is racemic 2-ethylhexanoate, the resulting metal complex is asymmetric because the complex has several different stereoisomeric forms. The size and shapes of organic portions of the ligands can be selected to optimize film stability and to adjust the thickness of film that will be deposited by the selected film deposition process.

The stability of an amorphous film 554 with respect to crystallization can also be enhanced by making the film 554 of a complex which has several different ligands attached to each metal atom. Such metal complexes have several isomeric forms. For example, the reaction of $CH_3HNCH_2CH_2NHCH_3$ with a mixture of a nickel(II) salt and KNCS leads to the production of a mixture of isomers. The chemical properties of the different isomers are known not to differ significantly, however, the presence of several isomers in the film impairs crystallization of the complex in the film.

Precursor 554 must also be stable, or at least metastable, in the sense that it will not rapidly and spontaneously decompose under process conditions. The stability of complexes of a given metal can depend, for example, upon the oxidation state of the metal in the complex. For instance, Ni(0) complexes are known to be unstable in air while Ni(II) complexes are air-stable. Consequently, a process for depositing Ni based films which includes processing steps in an air atmosphere should include a Ni(II) complex in preference to a Ni(0) complex. Several preferred metals and ligands used to form precursor layer 554 are disclosed in the Section III, below. Further, Section III discloses exemplary methods for depositing precursor layer 552 on the structure illustrated in FIG. 5D.

In one embodiment, precursor is deposited on the structure illustrated in FIG. 5D using a CEE spin coater at 5000 rpm, for a period of twenty seconds. In this embodiment, the precursor is $Ti(O_nBu)_2(DMEC)_2$, where DMEC stands for dimethylethylcarboxylate.

Step F—Partial conversion or conversion of precursor layer 554. Referring to FIG. 5E, in step F, precursor 554 is exposed to a converting and/or partial converting means 556, light rays being illustrated here, directed through mask 558. Mask 558 includes transparent substrate 560, exemplified as glass in FIG. 5E, having regions 562 that are substantially opaque to the converting or partial converting means. As used herein, the term transparent means transparent to visible light. The portion of precursor 554 exposed to converting and/or partial converting means 556 is at least partially converted or reacted to form regions of partially converted precursor 570. In some embodiments, an OAI (San Jose, Calif.) deep ultraviolet contact aligner is used to expose precursor 554 during step F. For more information on deep ultraviolet resist technology and methods for patterning such materials, see Chapter 4 of Rai-Choudhury 1997, *Handbook of Microlithography, Micromachining, and Microfabrication, Volume 1: Microlithography*, SPIE Press, which is hereby incorporated by reference.

Preferably, partially converted precursor 570 is substantially fully converted (e.g., more than 60 percent by weight of the ligands in precursor 554 have been removed, more than 70 percent by weight of the ligands in precursor 554 have been removed, more than 80 percent by weight of the ligands in precursor 554 have been removed, more than 90 percent by weight of the ligands in precursor 554 have been removed, more than 60 percent by weight of the ligands in precursor 554 have been removed, etc.).

Partial conversion and conversion result from a chemical reaction within precuror 554 which changes the partially converted or converted regions 570 into a desired converted material. Ideally, at least one ligand in precursor 554 should be reactive and be attached to the complex by a bond that is cleaved when the precursor 554 is raised to an excited state by the influence of the partial converting means and/or the converting means 556. Preferably the reactive group is severed from the complex in a photochemical reaction initiated by light, more preferably, by ultraviolet light, by the partial converting means and/or the converting means 556. To make such photochemical step(s) in the process efficient, it is preferable that the intermediate product produced when the reactive group is severed be unstable and spontaneously convert to the desired new material and volatile byproduct(s).

There are several mechanisms by which a suitable photochemical reaction in accordance with step F can occur. Some examples of suitable reaction mechanisms that may be operable, individually or in combination, according to the invention are as follows: (a) absorption of a photon may place the complex in a ligand to metal charge transfer excited state in which a metal-to-ligand bond in the metal complex is unstable, the bond breaks and the remaining parts of the complex spontaneously decompose, (b) absorption of a photon can place the complex in a metal-to-ligand charge transfer excited state in which a metal-to-ligand bond in the complex is unstable, the bond breaks and the remaining parts of the complex spontaneously decompose, (c) absorption of a photon can place the complex in a d-d excited state in which a metal-to-ligand bond in the complex is unstable, the bond breaks and the remaining parts of the complex spontaneously decompose, (d) absorption of a photon can place the complex in an intramolecular charge transfer excited state in which a metal-to-ligand bond in the complex is unstable, the bond breaks and the remaining parts of the complex spontaneously decompose, (e) absorption of a photon can place at least one ligand of the complex in a localized ligand excited state, a bond between the excited ligand and the complex is unstable, the bond breaks and the remaining parts of the complex spontaneously decompose, (f) absorption of a photon can place the complex in an intramolecular charge transfer excited state such that at least one ligand of the complex is unstable and decomposes, then the remaining parts of the complex are unstable and spontaneously decompose, (g) absorption of a photon can place at least one ligand of the complex in a localized ligand excited state wherein the excited ligand is unstable and decomposes, then the remaining parts of the complex are unstable and spontaneously decompose, and (h) absorption of a photon can place the complex in a metal-to-ligand charge transfer excited state in which at least one ligand of the complex is unstable and decomposes, then the remaining parts of the complex are unstable and spontaneously decompose. In its broad aspects, however, this invention is not to be construed to be limited to these reaction mechanisms.

In some embodiments, converting and/or partial converting means 556 comprises exposing the entire film, or selected regions of the deposited precursor film, to a source of energy. The energy source may be, e.g., a light source of a specific wavelength, a coherent light source of a specific wavelength or wavelengths, a broadband light source, an electron beam ("e-beam") source, or an ion beam source. Light in the wavelength range of from about 150 to about 600 nm is suitably used. In one preferred embodiment, the wavelength of the light is from about 157 to about 436 nm. In another preferred embodiment, the wavelength of light is between about 193 nm and 248 nm.

In certain embodiments of the invention, the energy source is a light source directed through an optical mask used to define a pattern on the surface. The mask consists of substantially transparent and substantially opaque or light absorbing regions. The mask can also include an optical enhancing feature that is generally referred to as resolution enhancement technology (e.g., phase shift technology, optical proximity correction, etc.). However, the energy source need not be directed through a mask. For example, if it is not necessary to pattern the material, a flood or blanket energy exposure can be used, such as is provided by thermal energy or a wide beam of light.

The atmosphere and pressure, both total and partial, under which the deposited film is at least partially converted can be important process variables. Normally, it is convenient and economical for the atmosphere to be air but it can be preferable to change the composition of the atmosphere present during at least partial conversion. One reason for this is to increase the transmission of the exposing light, if short wavelength light is used, because such light can be attenuated by air. Thus, by varying the intensity of the light, e.g., increasing it, it is possible to initiate thermal reaction within the films to generate product films. It can also be desirable to change the composition of the atmosphere to alter the composition or properties of the product film. For example, the exposure of a copper complex results in the formation of a copper oxide in air or oxygen atmospheres. By virtually eliminating oxygen from the atmosphere, a film comprising primarily reduced copper species can be formed. Additionally, the amount of water in the film may be changed by changing the humidity of the atmosphere.

The use of a partial conversion step, or different conversion steps in sequence, also known as "substrate pretreatment", can be advantageous from a process flow standpoint, for example, in order to minimize the time during which a precursor atop a substrate needs to be exposed in an expensive piece of equipment, such as a stepper.

Figure 5F:
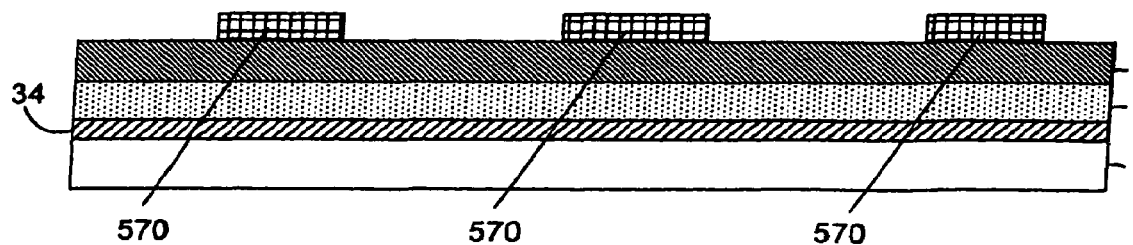
Figure 5G:
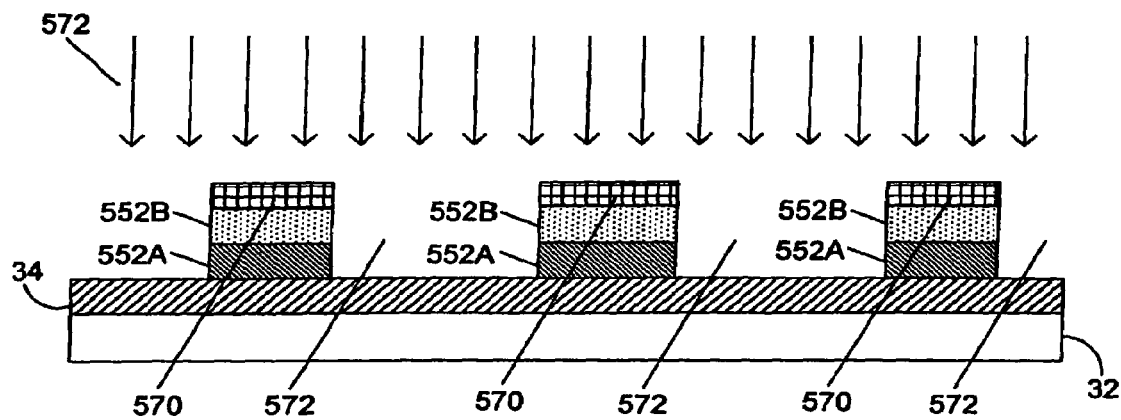
Figure 5H:
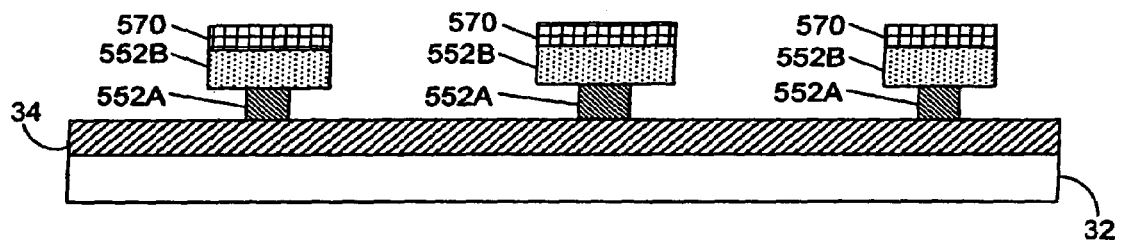

Step G—Development of precursor layer 554. After exposure to a converting and/or partial converting means 556, the assembly is exposed to a removing means (not shown) such as a liquid developer. As a result, substantially unconverted precursor 554 is removed by the removing means, e.g., a developer, exposing pattern transfer layer 552, while at least partially converted precursor 570 which, being at least partially converted, resists the removing means, remains. The resulting assembly is illustrated in FIG. 5F.

Unexposed regions of the deposited film, or a portion thereof, can then be removed by the application of a removing (or developing) means. For example, a developing means can comprise a developer composition that can be applied as a liquid or a solution in a puddle development or immersion wet development process. Alternately, a dry development process analogous to dry patterning steps conventionally employed by the semiconductor industry can be employed as a developing means. Preferred removal means include spray development, puddle development, and immersion wet development.

The developer is typically formulated and/or used under conditions such that a solubility difference exists between exposed and unexposed regions of layer 554. This solubility difference is used to remove preferentially select regions of the film such that certain chosen regions of layer 554 are substantially removed by the developer while regions 570 desired to remain on substrate 32 are left substantially intact. Considerable experimentation can be required to optimize the formulation of the developer. For example, in a process in which regions that have been exposed to incident energy are desired to remain on the substrate, use of the casting solvent to develop the film after exposure to incident radiation is too aggressive. A dilute solution of the casting solvent in another liquid in which (a) the casting solvent is miscible, (b) unexposed regions of the film are sparingly (but not necessarily completely) soluble, and (c) exposed regions of the film are substantially insoluble, provides for an improved development process.

For instance, in one preferred embodiment of the invention an amorphous film can be cast from a ketone solution. Use of the ketone alone as a developer, or a ketone-rich mixture of alcohol and the ketone, e.g., a mixture with greater than 50 vol. % ketone, results in a development process that is less effective than when the alcohol is the majority component. For instance, 10:1 (vol/vol) IPA:MIBK solution is a more effective developer for $Ba_xSr_yTi_2O_3$ ("BST") than MIBK alone or 1:1 (vol/vol) IPA:MIBK, where "IPA" signifies isopropyl alcohol. The 10:1 mixture, in turn, is less effective than 20:1 IPA:MIBK. However, both of the 10:1 and 20:1 solutions are more effective than a solution of 40:1 (vol/vol) IPA:MIBK. Furthermore, the relative effectiveness of these solutions depends heavily on other processes employed in the formation of the patterned film including, for example, the type and energy of incident radiation and the temperature of the substrate during coating and patterning. Thus, the determination of an appropriate developer formulation for the present invention requires experimentation. Liquid and/or solution-based developers can be physically applied in a fashion analogous to development methods employed with photoresist-based processes, for example, those discussed above.

Optionally, a converting means (not shown) is applied to the partially converted precursor 570, if it has not already been substantially fully converted, to form substantially fully converted precursor. This conversion can be accomplished, e.g., by a blanket light exposure step or a thermal or heat annealing step.

In one specific embodiment, step G is effected by spin developing the precursor layer by applying (1:10) methyl isobutyl ketone:hexane (MIBK:hexane) using a CEE spin coater. In one instance, the developer is applied at a speed of 500 rpm for a period of time of twenty seconds.

Once substantially converted or fully converted (e.g., once a significant amount of ligand has been removed from portions 570) portions 570 are substantially a metal oxide that has hard mask properties. As such portions 570 effectively serve as a patterned hard mask. One of skill in the art will appreciate the many advantages that steps A through F. Steps A through F realize a patterned hard mask without the need for time consuming conventional intermediate steps in which the hard mask is patterned by photolithography.

Step H—Optional post-development treatment. After development, the at least partially converted precursor 570 can optionally be treated by any of a variety of methods well known to the art prior to its being subjected to a converting means. These methods include but are not limited to annealing treatments, such as thermal, laser or plasma annealing. The temperature and time of such annealing are important variables. The annealing step can also be influenced by prior surface treatments, for example, oxygen plasma, laser or a rapid thermal annealing ("RTA") process. It is possible to select appropriate conditions such that the annealed at least partially converted precursor retains its amorphous nature while at least one of its physical or electrical properties is desirably altered. Alternatively, annealing conditions that cause the film to convert to its crystalline state, e.g., a high temperature, can be desirable depending on the application for which the film is to be used. For example, appropriate thermal treatment at this stage can be employed to induce the formation of highly oriented crystalline films from the amorphous or at least substantially amorphous at least partially converted precursor. In this manner, the properties of the amorphous film can be finely tuned or its physical properties can even be varied over a wide range—from the completely amorphous phase at one extreme to semi-crystalline intermediate phases to a single oriented crystalline phase at the other extreme. Such thermal treatment will usually act to further convert the precursor.

If precursor 570 has yet to be substantially fully converted, the precursor film is next optionally but typically subjected to a converting means such that the precursor is substantially fully converted. The entire film 570 or selected regions of the precursor film 570 can be exposed to a source of energy. The converting means can be an energy source that can be the same as or different from any partial converting means previously employed. For example, the converting means can be a light source of a specific wavelength, a coherent light source of a specific wavelength, a broadband light source, an electron beam source, and/or an ion beam source. In certain embodiments of the invention, the energy source, or at least a portion of the energy source, is a light source directed through an optical mask used to define an image on the surface, as discussed above. However, the energy source need not be directed through a mask. For example, it may not be necessary to pattern the material during the conversion step, e.g., because the precursor can already be patterned, therefore, a flood or blanket exposure can be used as the converting means. Preferred converting means include light, electron beam, ion beam, and thermal treatment. As discussed above for partial conversion and as is also applicable here, the atmospheric conditions under which the deposited film is converted, such as atmosphere composition, pressure, both total and partial, and humidity, can be important process variables. During conversion, these variables can be the same as or different from their settings used in any preceding partial conversion step.

It is, of course, to be understood that, as a preferred thin film, e.g., hard mask, can be formed by substantially fully converting at least one portion of the partially converted precursor layer 570, the terms "substantially fully converted precursor", "fully converted precursor", "converted precursor", "substantially fully converted partially converted precursor", "fully converted partially converted precursor", and "converted partially converted precursor" as used herein all describe such a thin film.

It is recognized that during the process of partially converting and/or substantially fully converting the precursor film 554 to the film 570 of the desired material, that some shrinkage of the film may occur; that is, the thickness of the film of the desired material 570 is often less than the thickness of the unconverted precursor film 554. Therefore, the process of the invention provides the capability to apply relatively thicker cast films, conferring greater manufacturing ease, but also provides relatively thinner films of the desired at least partially converted precursor material, conferring improved properties to the film of the desired material. The shrinkage properties of the deposited film may be controlled and tuned to target parameters by judicious manipulation of process variables including: the selection of the precursor, the selection and quantity of the solvent, the identity of precursor additives, the thickness of the precursor film as determined by the deposition process, the use of thermal treatments before, during and after the patterning of the film, and the development of the exposed film. The present invention allows for precise thickness control of desired films ranging in total thickness from the angstrom range through the micrometer range. After conversion, subsequent optional process steps may include post-conversion treatment, developing, and post-developing treatment steps as described in U.S. Pat. Nos. 5,534,312, 5,821,017 and 6,071,676, each of which is incorporated herein by reference in its entirety.

Step I—Etching. In step I, the device is exposed to an etching means 572, such as the exemplified plasma etching chemistry. For example, a plasma etching means can consist essentially of oxygen. The etching means removes exposed areas of pattern transfer layer 552 while partially converted or substantially fully converted precursor portions 570 has been chosen and processed in such a fashion so as to render it substantially inert toward the etching means 570, such that etched regions 572 (FIG. 5G) are formed.

In some embodiments of the present invention, the etching used in step I comprises a wet etch technique such as immersion or spray etching. In preferred embodiments of the present invention, the etching used in step I is a dry form of etching such as plasma (barrel or planar), ion milling, or reactive ion etching. For more information on these known techniques, see Van Zant, 2000, *Microchip Fabrication*, Fourth Edition, McGraw-Hill, New York. In a preferred embodiment, an oxygen plasma is applied in step I using reactive ion etching.

Step J—Undercut. In step J, the device is exposed to etching that preferentially etches layer 552A relative to layer 552B, resulting in the undercut structure illustrated in FIG. 5H. Any form of etching that selectively etches layer 552A relative to layer 552B can be used in step J. This includes, but is not limited to, spray etching, wet etching, vapor etching, and plasma etching. For more information on these and other suitable etching techniques, see Van Zant, 2000, *Microchip Fabrication*, Fourth Edition, McGraw-Hill, New York. In a preferred embodiment, wet etching is used. Representative wet etchants include, but are not limited to, 1:8 hydroflouric acid:ammonium flouride ($HF:NH_4F$), 2:1 acetic acid:$NH_4F$, 16:1:1:2 $H_3PO_4:HNO_3$:Acetic acid:$H_2O$, $H_3PO_4$, and 50:20:3 $HNO_3:H_2O:HF$. In some embodiments, developers such as AZ312MIF, AZ327MIF, AZ351, AZ400K, or AZ developer (Hoechst Celanese, Somerville, N.J.) are used. In one specific embodiment 4:1 $H_2O$:AZ400K developer is used to effect etching step J.

Figure 5I:
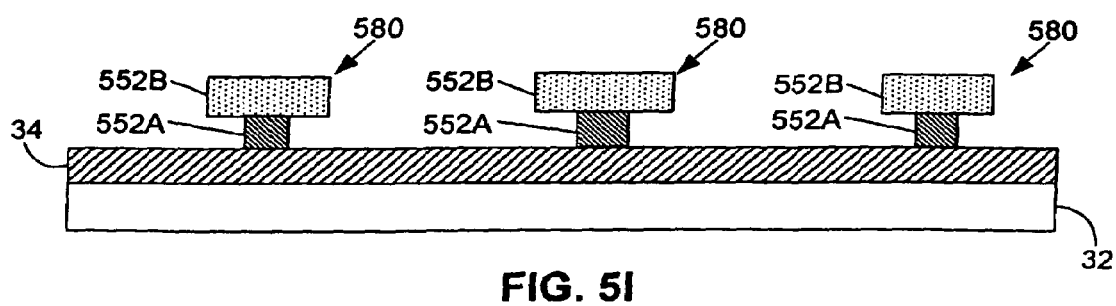

Step K—Optional removal of layer. In optional step K, as illustrated in FIG. 5I, hard mask layer 570 can be removed. In fact, in some embodiments hard mask layer 570 is optionally removed prior to Step J and in some embodiments hard mask layer 570 is optionally removed after Step J. There are a number of ways in which hard mask layer 570 can be optionally removed. For example, any of the EKC (Hayward, Calif.) 600 series of post etch residue removers can be used. For example, in some instances, exposure of the hard mask layer 570 to an EKC (Hayward, Calif.) 600 series post etch residue remover at room temperature for a period of fifteen minutes will typically remove hard mask layer 570. Furthermore, compounds disclosed in U.S. Pat. No. 5,792,274 to Tanabe et al., U.S. Pat. No. 6,235,693 to Cheng et al., and U.S. Pat. No. 6,248,704 to Small et al. can be used to remove hard mask layer 570.

Steps A through J (and optional step K) result in the formation of undercut structures 580 (FIG. 5I). During operation of the organic electroluminescent device, undercut structures 580 will prevent any electrical shorting of the device, more specifically, "cross-talk" between the cathode electrodes 42 and leakage between the anode 34 and the cathode 42 defined by electrically conductive material layer 34 and the second conductive metal layer (discussed shortly).

Figure 1:
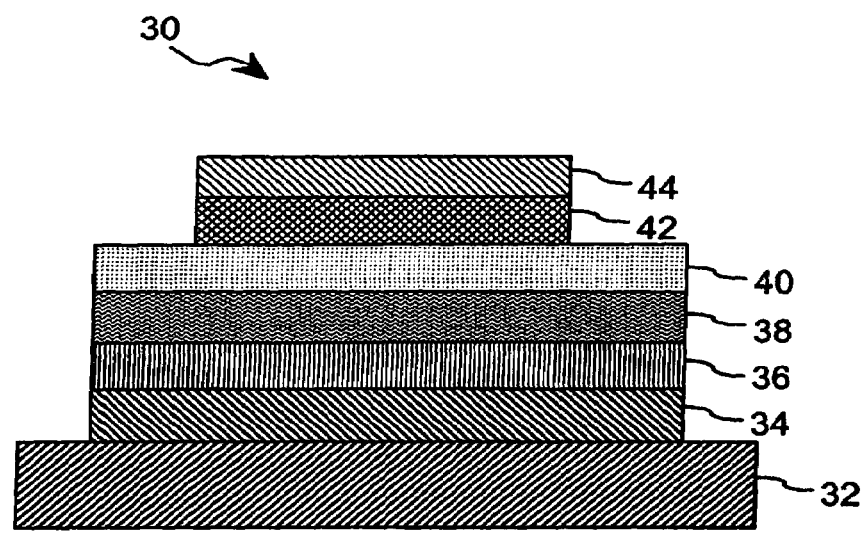
FIG. 1 illustrates an organic light-emitting diode (OLED) in accordance with the prior art.
Figure 5J:
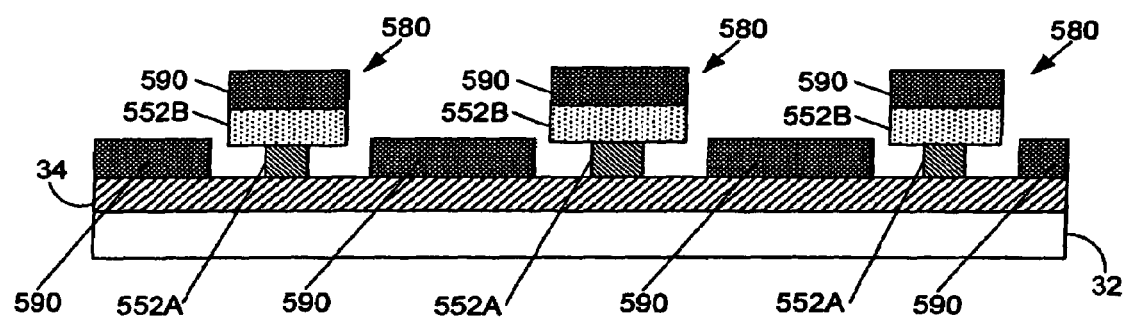

Step L—Organic layer deposition. In step L, as illustrated in FIG. 5J, one or more layer of organic electroluminescent material is deposited atop the structure of FIG. 5K (or FIG. 5H). As is well known in the art, the organic layers of an organic electroluminescent device comprises at least one and up to five layers of materials: a hole injecting layer, a hole transport layer, an emissive layer, an electron transport layer, and electron injecting layer. For purposes of this embodiment of the invention, the series of layers are illustrated as but one single electroluminescent medium layer 590 (FIG. 1, layers 36–40) deposited on the structure of FIG. 5K. Hence, the organic electroluminescent layers are deposited in the fashion so that they coat both the tops of undercut structures 580, as well as the exposed portions therebetween, specifically, the opening between two adjacent undercut structures 580. Thus, a layer of organic electroluminescent medium 590 is disposed on the exposed area of layer 32 between undercut structures 580. The exact organic materials selected for use in the layers of the organic electroluminescent material may be any of those known in the art. In some embodiments, organic electroluminescent medium 590 is generally fabricated to a thickness between 200 and 2000 Angstroms.

In some embodiments, the layers 590 of organic electroluminescent medium are deposited by vacuum evaporation. In other embodiments, the layers 590 of organic electroluminescent medium are deposited by other techniques such as injection-fill, spin-coating, roll-coating, dip-coating or doctor-blading from a suitable solution when polymeric materials are used. A mixture of the above-mentioned techniques may be needed in cases where a heterostructure array composed of both small organic molecule materials and polymers is to be built.

Figure 5K:
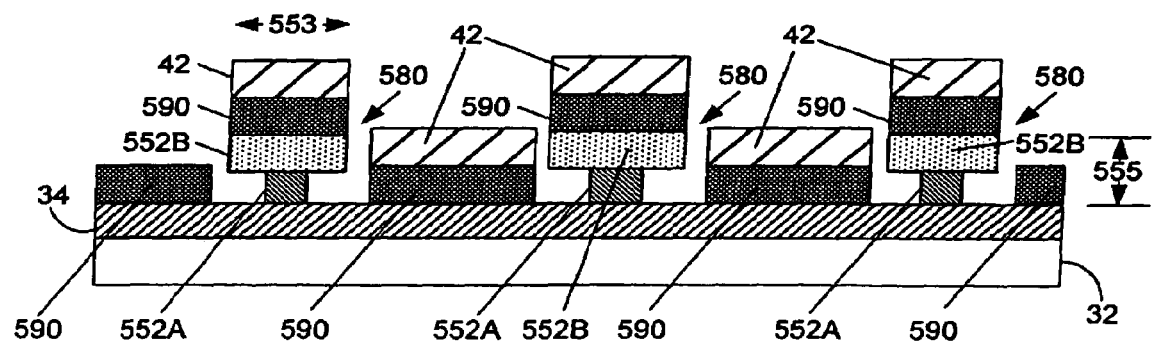

Step M—Upper electrode deposition. In step M, as illustrated in FIG. 5K, a layer of a second electrode 42 is deposited over organic layer 590. The second electrode is typically fabricated of a metal of work function of less than 4 electron volts and at least one other protected metal of higher work function. In some embodiments, the low work function metal is selected from the group of lithium, magnesium, calcium, strontium, and combinations thereof. In some embodiments, the high work function metal is selected from the group of aluminum, indium, copper, gold, silver and combinations thereof. Alternatively, second electrode 42 is formed of a alloy of lower work function metal and a high work function metal by co-evaporation. The content of the low work function metal and the second electrode can vary, for example, from 0.1% to 50% but typically is below about 20%. It should be understood that the layer of metal which defines second electrode 42 is automatically patterned due to the underlying undercut structures 580. Accordingly, no mechanical patterning of second electrode 42 is required during the manufacturing of the OLED devices of the present invention.

As is well known in the art, during operation of the OLED device of the present invention, holes inject from the first electrode (also called the anode) 34 and electrons inject from the second electrode 42 (also known as the cathode), into the organic layers 590 disposed between the electrically conductive electrodes, when an electrical current is applied between the anode and the cathode. An electrical current may be applied by connecting the electrodes to electrical current generating means (not shown). The electric current generating means attached to both electrodes 34 and electrodes 42, and will allow holes and electrons to recombine in the organic layer to generate a desired optical characteristic. Conversely, no current will flow through those portions of layer 42 fabricated atop undercut structures 580, since said portions of layer 42 are electrically isolated from both electrodes 34 and 42 by undercut structures 580 (layers 552A and 552B). Thus, while layers of organic and electrode materials are deposited atop undercut structures 580, undercut structures 580 themselves prevent those devices from being operative organic electroluminescent display pixels. Conversely, the devices disposed in the exposed areas between undercut structures 580 are operative pixel elements that are optically isolated from one another by the undercut structures 580. Hence, a pixelated organic electroluminescent display device, defining a plurality of pixellated picture elements, is provided by means of conventional fabrication processes, without incurring shorting out or cross-talk between the conductive material layers. In addition, the device of the present invention is amenable to consistent commercial manufacturing line technology, provides for a high throughput or yield, high reliability and low manufacturing costs.

Figure 6:
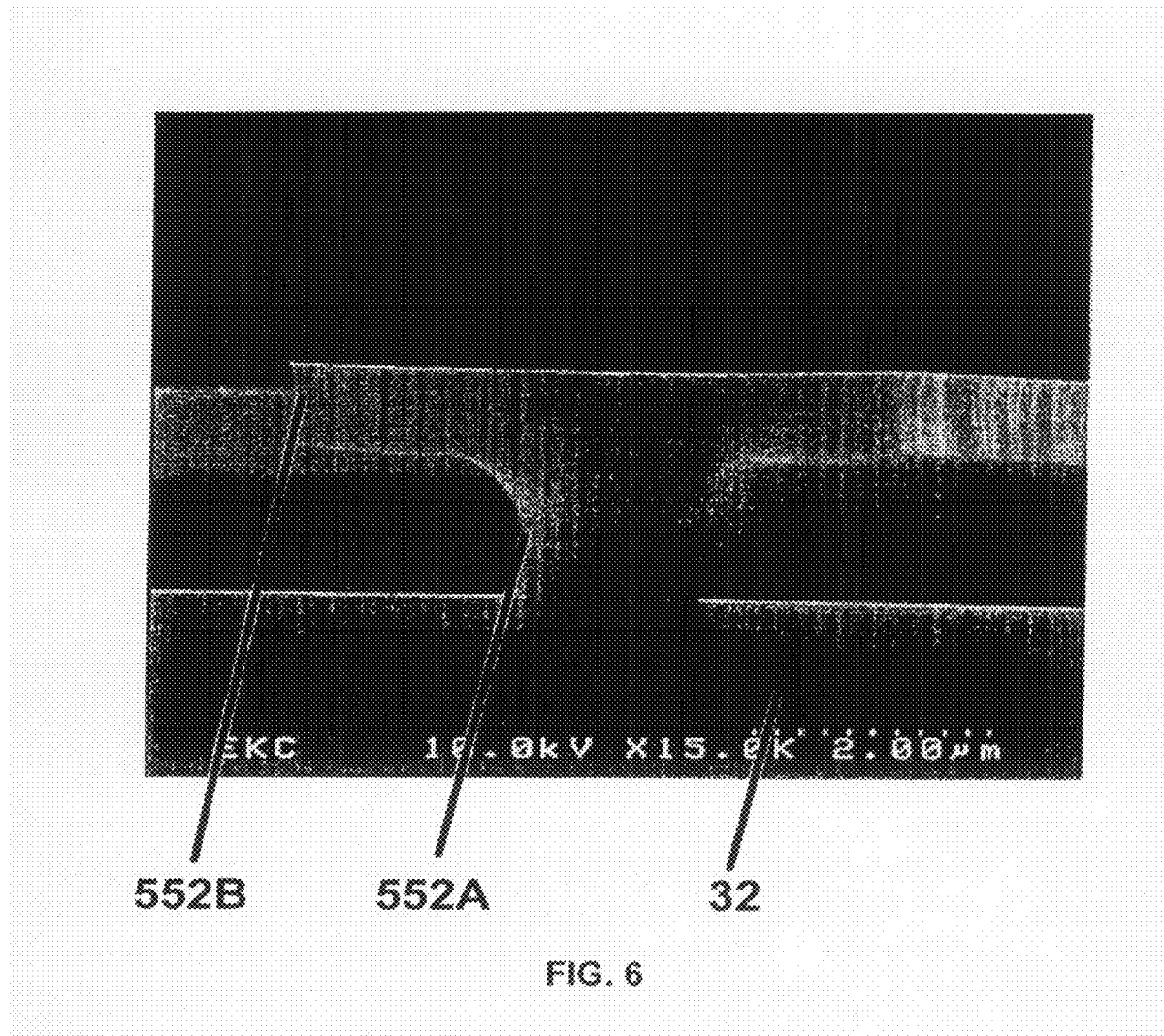
FIG. 6 illustrates the manufacture of passive matrix OLEDs at an intermediate processing step in accordance with an embodiment of the present invention.

FIG. 6 illustrates an electron microscopy image of a device in accordance with the present invention at the process stage schematically illustrated in FIG. 5I. The present invention provides improved profiles for undercut structures 580. By building the devices using two layers using the novel hard masks of the present invention selective undercut etching can be achieved.

Novel processing steps useful for the manufacture of passive matrix OLED-based displays have been described. Accordingly, one aspect of the invention provides structures that are made by these novel processing steps. One embodiment of the present invention provides a light emitting display. The light emitting display comprises a substrate 32 having a surface. In some embodiments, substrate 32 is transparent. A first layer of transparent electrically conductive material (anode 32) is disposed on the surface of the transparent substrate and patterned to form a plurality of laterally spaced apart strips having a first direction. Next, a plurality of spacedly disposed light emitting organic elements (organic layer, e.g., layers 36–40) with a second layer of electrically conductive material atop (cathode 42) are disposed on the first layer of transparent electrically conductive material in a second direction. The first direction intersects the second direction. Next, a first undercut structure (e.g., structure 580 of FIGS. 5I–5K) comprised of a first pattern transfer layer 552A and a second pattern transfer layer 552B overlayed on the first pattern transfer layer 552A, is disposed between the plurality of spacedly disposed light emitting organic elements. In some embodiments, the first direction is orthogonal to the second direction. In some embodiments, the first pattern transfer layer comprises a polyimide and the second pattern transfer layer comprises a polymer having different wet etch properties than said first pattern transfer layer. In some embodiments, the second pattern transfer layer is made from an acrylic type resin, a styrene type resin, a novolac resin or a polyolefin type resin. In some embodiments, the light emitting display is a passive matrix OLED-based display.

Figure 3:
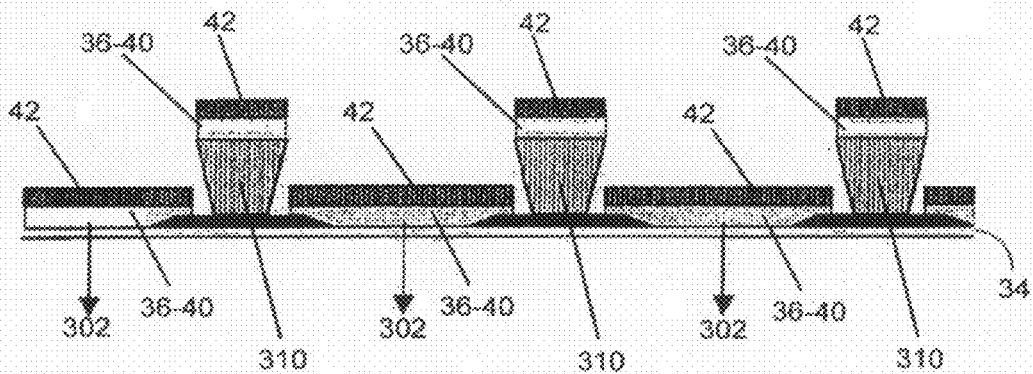
FIG. 3 illustrates a method of isolating cathode rows using an undercut pillar in a passive matrix OLED in accordance with the prior art.
Figure 4:
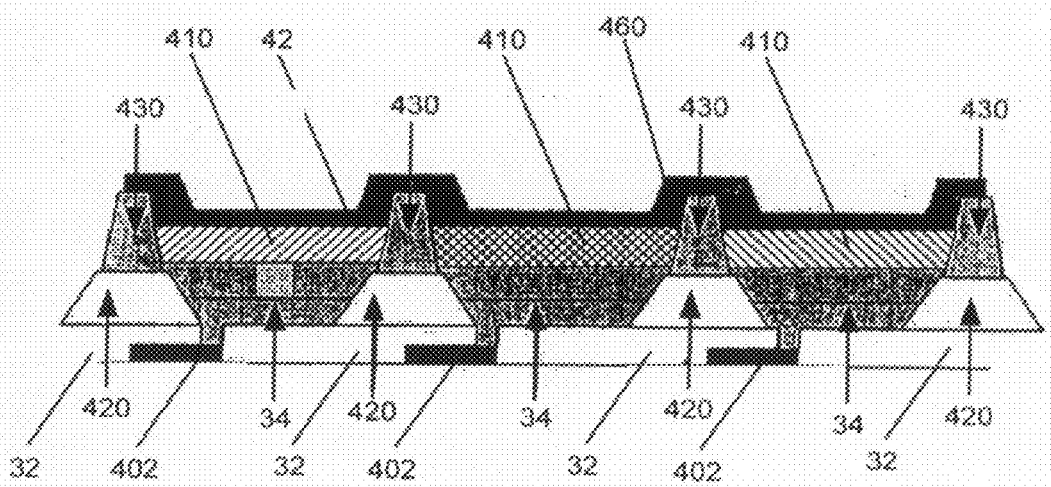
FIG. 4 illustrates an color active matrix OLED having an isolation barrier in accordance with the prior art.

An advantage of the present invention is that feature size of structures 580 can be made smaller than the feature size of structures used to perform the same function in the prior art (e.g. undercut pillar 310 of FIG. 3). Referring to FIG. 5K, in some embodiments, undercut structures 580 have a length 553 that is between 100 nm and 500 microns and a width (not shown) that is between 100 nm and 400 microns. In some embodiments, length 553 is between 25 microns and 35 microns whereas and the width is between 15 microns and 25 microns. As referred to herein, the length 553 and width of undercut structures is measured at a top portion of the undercut structure rather than the etched undercut portion of the structure 580. In some embodiments, the thickness 555 (FIG. 5K) of structures 580 (the aggregate thickness of layers 552A and 552B) is between about 0.75 microns and about 4.5 microns. In a more preferred embodiment, the thickness 555 of structures 580 is between about 2 microns and 3 microns.

II. Manufacture of Color Matrix OLED Displays

Figure 7A:
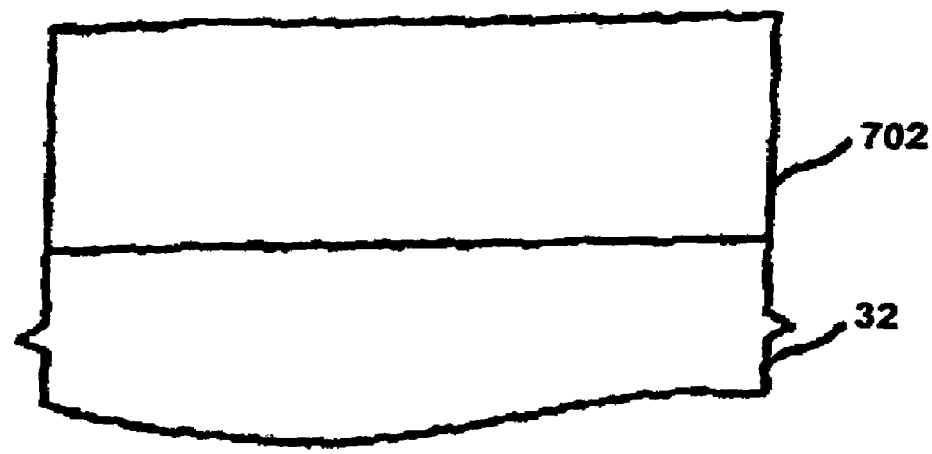
FIGS. 7A–7D illustrate the processing steps used to manufacture a color isolation well in a color OLED in accordance with an embodiment of the present invention.

This aspect of the present invention provides novel self-aligning dual damascene type methods for making color isolation wells for color matrix OLED display applications. FIG. 7 illustrates an exemplary embodiment in accordance with this aspect of the invention. In FIG. 7A, a substrate 32 is coated with a first well layer 702.

The exact composition of first well layer 702 is application dependent. In some embodiments, the composition of the material used to form first well layer 702 is chosen such that it has good wetability properties for the predetermined emissive polymer or small molecule dye that will be deposited in the color isolation well once it has been formed. For example, in some embodiments, if the predetermined emissive polymer or small molecule dye is a hydrophobic material, the material used to make first well layer 702 is selected for its hydrophobic properties. In another example, if the predetermined emissive polymer or small molecule dye is a hydrophilic material, the material used to make first well layer 702 is selected for its hydrophilic properties. In still another example, if the predetermined emissive polymer or small molecule dye is a positively charged material, the material used to make first well layer 702 is selected for its ability to present a negatively charged surface area. Those of skill in the art will appreciate that, because the present invention does not require the use of photoresists to make color isolation wells, any material amendable to lithography can be used to make first well layer 702.

Figure 7B:
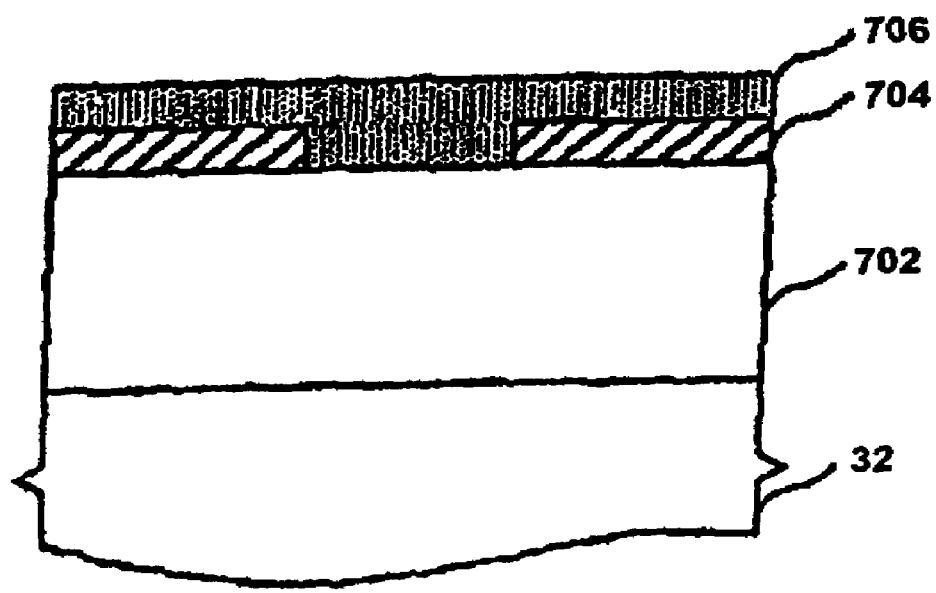

In FIG. 7B, a first precursor layer, e.g., comprising a metal complex, is applied atop first well layer 702. The first precursor layer is equivalent to layer 554 of FIG. 5D. The first precursor layer can be deposited using any of the techniques described in Step E of Section I of the present invention as well as in Section III of the present invention, below. Further, the first precursor layer can be made out of any of the materials used to make layer 554 of Section I of the present invention, above, as well as those materials described in Section III of the present invention, below. After deposition, the first precursor layer is patterned using any of the techniques described in Section I, above. Specifically, the first precursor layer is subjected to a partial conversion step in the same manner that layer 554 is subjected to such a process in Step F of Section I, above, and as illustrated in FIG. 5E. Then, the assembly is exposed to a removing means, such as the removing means described in step G of Section I, above, and as illustrated in FIG. 5F. This results in the removal of substantially unconverted precursor from the device, leaving first patterned layer 704 as illustrated in FIG. 7B. Advantageously, first patterned layer 704 serves as a hard mask in subsequent processing steps, below.

A second well layer 706 is then applied atop first patterned layer 704 and exposed portions of first well layer 702. In some embodiments, second well layer 706 is any organic-based coating that can be spun on to the assembly. In some embodiments, the material used to make second well layer 706 is the same as the material used to make first well layer 702. In other embodiments, the material used to make second well layer 706 is different then the material used to make second well layer 702. In some embodiments, the material used to make second well layer 706 is selected for its poor wetability properties. For example, in instances where the predetermined emissive polymer or small molecule dye is a hydrophobic material, the material used to make first well layer 702 is selected for its hydrophilic properties. In another example, if the predetermined emissive polymer or small molecule dye is a hydrophilic material, the material used to make first well layer 702 is selected for its hydrophobic properties. In still another example, if the predetermined emissive polymer or small molecule dye is a positively charged material, the material used to make first well layer 702 is selected for its ability to present a positively charged surface area. Without intending to be limited to any particular theory, selection of a material for second well layer 706 that is not compatible with the respective predetermined emissive polymer or small molecule dye used to fill the color isolation well serves to "trap" the emissive material at the bottom of the well, thereby alleviating containment problems that are found in the prior art.

Figure 7C:
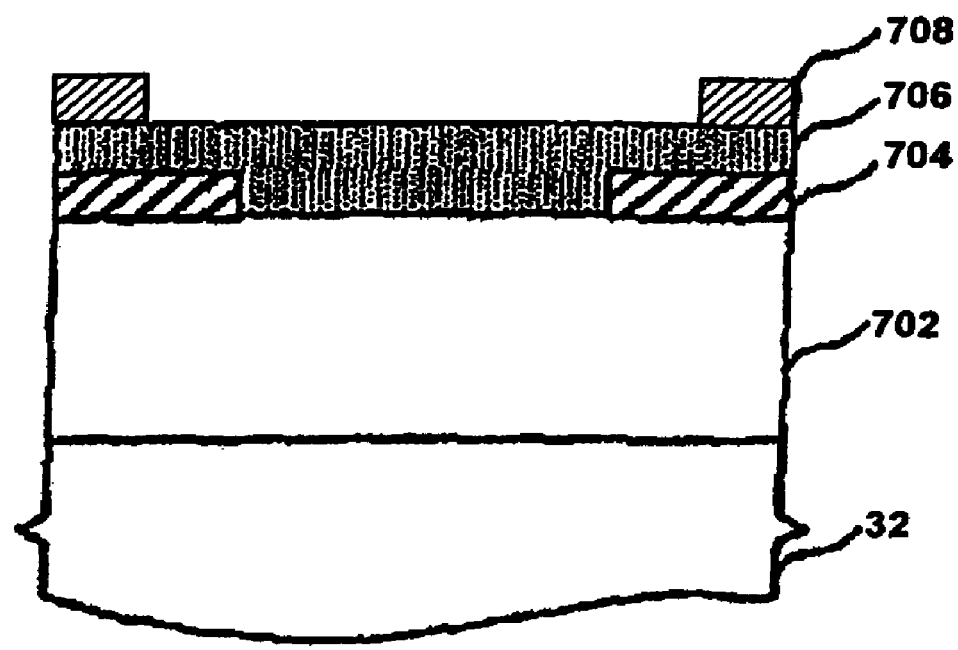

In the step illustrated in FIG. 7C, a second precursor layer has been deposited, patterned and developed to form second patterned layer 708, as illustrated, using techniques identical to those employed in the formation of first patterned layer 704 and/or described in Steps D through Step H of Section I, above. The second precursor layer can be made out of any of the materials that can be used to make the first precursor layer.

In step 7D, an etching means (not shown), such as plasma etching chemistry, is employed to remove the illustrated region of first well layer 702 and second well layer 706. Any of the techniques disclosed in Step I of Section I, can be used to perform the etching illustrated in FIG. 7D.

Figure 7D:
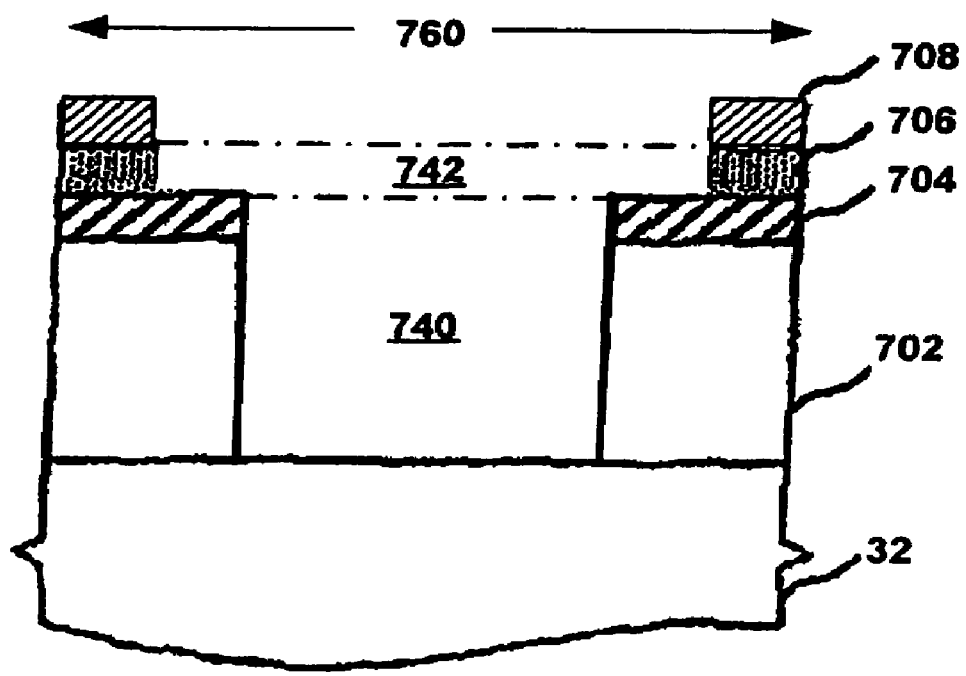

Novel processing steps useful for the manufacture of color OLED-based displays have been described. Accordingly, one aspect of the invention provides structures that are made by these novel processing steps. One embodiment of the present invention provides a light emitting display comprising a color isolation well for holding an emissive polymer or small molecule dye. The color isolation well comprises a substrate 32 having a surface. In some embodiments, substrate 32 is a transparent substrate. A first well layer 702 (FIG. 7D) is disposed on the surface of the transparent substrate. The first well layer forms a first well region 740 (FIG. 7D) wherein the surface of the transparent substrate 32 is exposed in an interior portion of the first well region 740. A first patterned layer 704 is disposed on the first well layer 702. A second well layer 706 is disposed on the first patterned layer 704. The second well layer forms a second well region 742 that is in fluid communication with first well region 740 as illustrated in FIG. 7D. In some embodiments, the device further comprises a second patterned layer 708 that is disposed on the second well layer 706.

In some embodiments, the total thickness of layers 702, 704, 706, and 708 is between about 0.25 microns and about 5 microns. In other words, the thickness of the color isolation well is between about 0.5 microns and about 5 microns. In a more preferred embodiment, the total thickness of layers 702, 704, 706, and 708 is between about 1 micron and about 3 microns. In an even more preferred embodiment, the total thickness of layers 702, 704, 706, and 708 is between about 0.5 microns and about 1.5 microns. In one embodiment, the total thickness of layers 702, 704, 706, and 708 is about 1.5 microns. In some embodiments, the light emitting display comprises a passive matrix or active matrix OLED based display.

In some embodiments, each color isolation well has a length 760 (FIG. 7D) of between 75 microns and 500 microns and a width (not shown) of between 75 microns and 400 microns. In preferred embodiments, each color isolation well has a length 760 (FIG. 7D) of between 100 microns and 350 microns. In one embodiment, each color isolation well has a length 760 of about 300 microns. In preferred embodiments, each color isolation well has a width of between 80 microns and 150 microns. In one embodiment, each color isolation well has a width of about 100 microns.

As illustrated in FIG. 7D, in preferred embodiments of the present invention, second well layer 706 and second patterned layer 708 of the color isolation well are offset from first well layer 702 and first patterned layer 704. In such preferred embodiments, second well region 742 will have a larger width and length than first well region 740. Such embodiments are preferred because relatively larger dimensions of second well region 742 help to contain the predetermined emissive polymer or small molecule dye.

In some embodiments, a second well layer 706 is not used. In such embodiments second patterned layer 708 is coated directly over first patterned layer 702 and then first well layer 704 is overlayed on second patterned layer 708. Then, first well layer 704 is patterned and the device is subjected to etching to form the color isolation well. In such embodiments, second well regions 742 and first well region have the same dimensions. Such embodiments still advantageously hold predetermined polymer or ink in the well when materials for first patterned layer 702 are selected that compatible with a property of the predetermined polymer or ink and materials for second patterned layer 708 are selected that are incompatible with the predetermined polymer or ink. In some embodiments, a second patterned layer 708 is not used. In such embodiments, the color well is formed form just the first well layer and the first patterned layer. For example, one embodiment of the present invention provides a light emitting display comprising a color isolation well for holding an emissive polymer or small molecule dye, the color isolation well overlaying a transparent substrate, the color isolation well comprising (i) a first well layer disposed on the transparent substrate, the first well layer forming a first well region, and (ii) a first patterned layer disposed on the first well layer, wherein the first patterned layer is formed from a first precursor.

III. Exemplary Precursors and Methods of Deposition

This section describes various metal complex and their metal ligand components that can be used to make the precursor layer 554 (FIG. 5D) of Section I and the first and second precursor layers (FIG. 7B) of Section II. For more information see U.S. patent application Ser. No. 09/875,115 to Maloney et al., published as US 2002/0076495. This section also describes various considerations that are made when depositing such complexes.

Exemplary metal complexes, and their metal and ligand components, are described in U.S. Pat. No. 5,534,312 which is incorporated herein by reference in its entirety. Preferred metal complex precursors include ligands which meet the above criteria. More preferably, the ligands are selected from the group consisting of acetylacetonate (also known as "acac" or 2,4-pentanedione) and its anions, substituted acetylacetonate, i.e.,

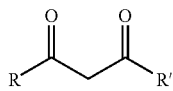

and their anions, acetonylacetone (also known as 2,5-hexanedione) and its anions, substituted acetonylacetone, i.e.,

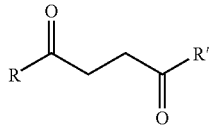

and its anions, dialkyldithiocarbamates, i.e.,

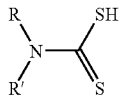

and its anions, carboxylic acids, i.e.,

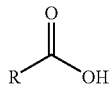

such as hexanoic acid where $R=CH_3(CH_2)_4$, carboxylates, i.e.,

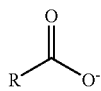

such as hexanoate where $R=CH_3(CH_2)_4$, pyridine and/or substituted pyridines, i.e.,

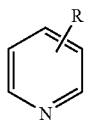

azide, i.e., $N_3^-$, amines, e.g., $RNH_2$, diamines, e.g., $H_2NRNH_2$, arsines, i.e.,

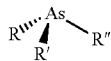

diarsines, i.e.,

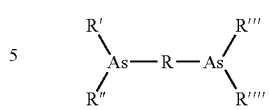

phosphines, i.e.,

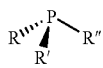

diphosphines, i.e.,

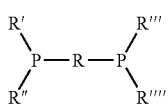

arenes, i.e.,

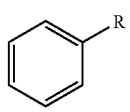

hydroxy, i.e., OH⁻, alkoxy ligands, e.g., RO⁻, ligands such as $(C_2H_5)_2NCH_2CH_2O$—, alkyl ligands, e.g., R⁻, aryl ligands, and mixtures thereof, where each R, R', R", R'", and R"" is independently selected from organic groups and, preferably, is independently selected from alkyl, alkenyl, aralkyl and aralkenyl groups.

As used herein, the term "alkyl" refers to a straight or branched hydrocarbon chain. As used herein, the phrase straight chain or branched chain hydrocarbon chain means any substituted or unsubstituted acyclic carbon-containing compounds, including alkanes, alkenes and alkynes. Examples of alkyl groups include lower alkyl, for example, methyl, ethyl, n-propyl, iso-propyl, n-butyl, iso-butyl, tert-butyl or iso-hexyl; upper alkyl, for example, n-heptyl, -octyl, iso-octyl, nonyl, decyl, and the like; lower alkylene, for example, ethylene, propylene, propylyne, butylene, butadiene, pentene, n-hexene or iso-hexane; and upper alkylene, for example, n-heptene, n-octene, iso-octene, nonene, decene and the like. The ordinary skilled artisan is familiar with numerous straight, i.e., linear, and branched alkyl groups, which are within the scope of the present invention. In addition, such alkyl groups may also contain various substituents in which one or more hydrogen atoms is replaced by a functional group or an in-chain functional group.

As used herein, the term "alkenyl" refers to a straight or branched hydrocarbon chain where at least one of the carbon-carbon linkages is a carboncarbon double bond. As used herein, the term "aralkyl" refers to an alkyl group which is terminally substituted with at least one aryl group, e.g., benzyl. As used herein, the term "aralkenyl" refers to an alkenyl group which is terminally substituted with at least one aryl group. As used herein, the term "aryl" refers to a hydrocarbon ring bearing a system of conjugated double bonds, often comprising at least six π(pi) electrons. Examples of aryl groups include, but are not limited to, phenyl, naphthyl, anisyl, toluyl, xylenyl and the like. The term "functional group" in the context of the present invention broadly refers to a moiety possessing in-chain, pendant and/or terminal functionality, as understood by those persons of ordinary skill in the relevant art. As examples of in-chain functional groups may be mentioned ethers, esters, amides, urethanes and their thio-derivatives, i.e., where at least one oxygen atom is replaced by a sulfur atom. As examples of pendant and/or terminal functional groups may be mentioned halogens, such as fluorine and chlorine, and hydrogen-containing groups such as hydroxyl, amino, carboxyl, thio and amido, isocyanato, cyano, epoxy, and ethylenically unsaturated groups such as allyl, acryloyl and methacryloyl, and maleate and maleimido.

To enhance the desired photochemical characteristics, including the tendency of the products of the photochemical reaction to spontaneously thermally decompose, ligands comprising and/or selected from one or more of the following groups may be used alone or in combination with the above-listed ligands: oxo, i.e., $O_2^-$, oxalato, i.e.,

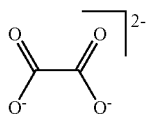

halide, hydrogen, hydride, i.e., $H^-$, dihydride, i.e., $H_2$, hydroxy, cyano, i.e., $CN^-$, carbonyl, nitro, i.e., $NO_2$, nitrito, i.e., $NO_2^-$, nitrate, i.e, $NO_3$, nitrato, i.e., $NO_3^-$, nitrosyl, i.e., NO, ethylene, acetylenes, i.e.,

R≡R' thiocyanato, i.e., $SCN^-$, isothiocyanato, i.e., $NCS^-$, aquo, i.e., $H_2O$, azides, carbonate, i.e., $CO_3^{-2}$, amine, and thiocarbonyl, where each R and R' is independently selected from organic groups and, preferably, is independently selected from alkyl, alkenyl, aralkyl and aralkenyl groups. Even more preferably, each ligand is independently selected from acac, carboxylates, alkoxy, oxalato, azide, carbonyl, nitro, nitrato, amine, halogen and their anions.

Preferably, the metal complex precursor is selected from those comprising at least one ligand selected from the group consisting of acac, carboxylato, alkoxy, azide, carbonyl, nitrato, amine, halide, nitro, and mixtures thereof and at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof.

The precursor can be applied to the substrate directly. Alternatively and preferably, the precursor is dissolved in a solvent or solvents to form a precursor solution. This facilitates its application to the substrate by a variety of means well known to those of ordinary skill in the art, such as by spin or spray application of the solution to the substrate. The solvent can be chosen based on several criteria, individually or in combination, including the ability of the solvent to dissolve the precursor, the inertness of the solvent relative to the precursor, the viscosity of the solvent, the solubility of oxygen or other ambient or other gases in the solvent, the UV, visible, and/or infra-red absorption spectra of the solvent, the absorption cross-section of the solvent with respect to electron and/or ion beams, the volatility of the solvent, the ability of the solvent to diffuse through a subsequently formed film, the purity of the solvent with respect to the presence of different solvent isomers, the purity of the solvent with respect to the presence of metal ions, the thermal stability of the solvent, the ability of the solvent to influence defect or nucleation sites in a subsequently formed film, and environmental considerations concerning the solvent. Exemplary solvents include the alkanes, such as hexanes, the ketones, such as methyl isobutyl ketone ("MIBK") and methyl ethyl ketone ("MEK"), and propylene glycol monomethyl ether acetate ("PGMEA").

The concentration of the precursor in the solution can be varied over a wide range and can be chosen by one of ordinary skill in the art with, at most, minimal routine experimentation, such that the properties of the precursor film, including its thickness and/or sensitivity to irradiation by light or particle beams, are appropriate for the desired application. However, the choice of precursor can have a significant influence on the properties of the desired film which is not readily predictable by one skilled in the art. For example, two precursors ML and ML', each consisting of metal M and one of two different ligand sets L or L', might be expected to form films of the desired material which are identical because, e.g., the portions of the ligands which differ from each other would be removed during conversion of the precursor into a hard mask. In fact, the supposedly identical film products of these two similar reactants can differ significantly in their properties. Examples of properties which can be affected in this process include the dielectric constant and the presence/absence of any secondary or tertiary structure in the film. Possible reasons for this difference can relate to the rate of formation of the amorphous material and the ability of the photo-ejected ligand to remove energy from the photo-produced film of desired material. The presence of ligand fragments during an exposure process can also affect the film forming process, influencing such phenomena as diffusion properties of the film, nucleation, and crystal growth.

Further, the choice of the precursor in film formation and photochemical exposure can substantially influence further reactivity of the film of the desired material with, for example, gaseous constituents of the atmosphere in which the desired film is formed. This could influence, for example, the rate of oxidation of the deposited film where either a high or low rate could be an advantage depending upon the desired product. Additionally, it is recognized that the effect of the precursor upon the healing ability of the film, e.g., its ability to minimize crazing, and the shrinkage or densification of the film can be substantially influenced by the choice of precursors that would otherwise be seen to yield identical results by one skilled in the art.

Chemical additives are optionally present with the precursor or in the precursor solution. These can be present for any or several of the following reasons: (i) to control the photosensitivity of a subsequently deposited precursor or film, (ii) to aid in the ability to deposit uniform, defect-free films onto a substrate, (iii) to modify the viscosity of the solution, (iv) to enhance the rate of film formation, (v) to aid in preventing film cracking during subsequent exposure of the deposited film, (v) to modify other bulk properties of the solution, and (vi) to modify in important ways the properties of the film of the desired material. The additives are chosen on these criteria in addition to those criteria employed when choosing a suitable solvent. It is preferable that the precursor or the precursor solution be substantially free of particulate contamination so as to enhance its film-forming properties.

IV. EXAMPLES

The following examples further illustrate certain embodiments of the present invention. These examples are provided solely for illustrative purposes and in no way limit the scope of the present invention.

Example 1

Figure 8:
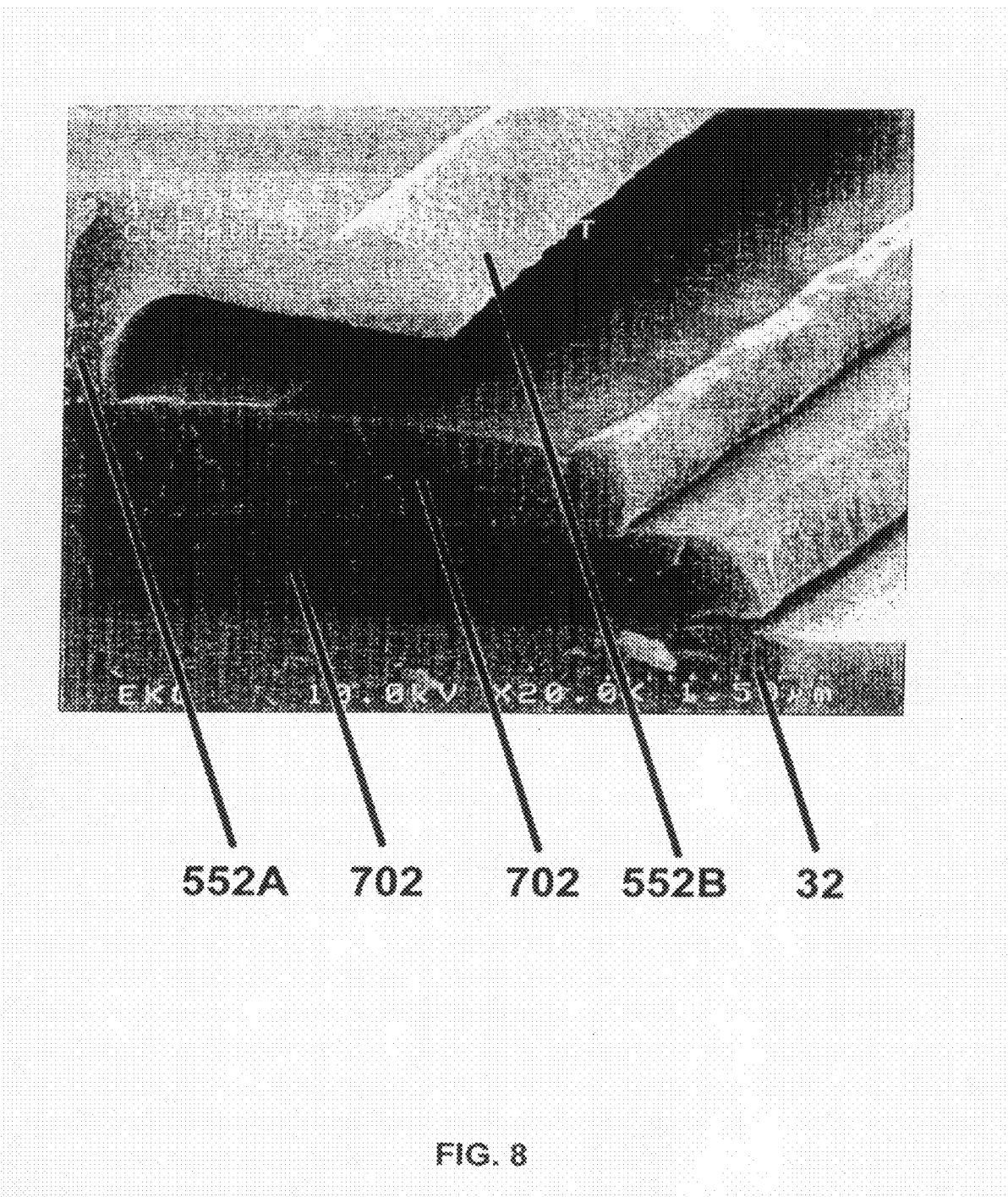
FIG. 8 illustrates a color isolation well and an undercut pillar produced by an exemplary process in accordance with the present invention.

The following example illustrates the manufacture of a color isolation well as well as an undercut pillar. The combination of a color isolation well and an undercut pillar finds application in, for example, passive matrix color-based OLED displays. The structure produced by this example is illustrated in FIG. 8. Spin TOK OFPR 800-20 photoresist is coated on a silicon substrate using a CEE Model 100CB manual spin coater at a speed of 5000 rpm, for 20 seconds. The photoresist is baked on a hotplate at 230° C. for 1 minute. Next, precursor is spin coated on the device using a CEE spin coater at a speed of 5000 rpm for a period of 20 seconds. The precursor is exposed using an OAI deep ultraviolet contact aligner for a period of fifteen minutes with a power of 1.8 mJ/cm$^2$. The precursor is then spin developed by a twenty second application of methyl isobutyl ketone:hexane:hexane (1:10) using a CEE spin coater at a speed of 500 rpm. Next, the precursor is post-developed using an ultra violet exposure applied with a UVEXS/OM 91-04C tool using one pass at one foot per minute. Photoresist (TOK OFPR 800-20) is then spin coated for twenty seconds onto the device using a CEE spin coater at a speed of 5000 rpm. The photoresist is baked by setting the substrate on a hotplate at 230° C. for one minute. Next, another coat of precursor is spin coated onto the device by application of the precursor using a CEE spin coater at a speed of 5000 rpm for 20 seconds. The precursor is exposed using an OAI deep ultraviolet contact aligner for a period of fifteen minutes with a power of 1.8 mJ/cm$^2$. Next the precursor is developed by a twenty second application of methyl isobutyl ketone:hexane:hexane (1:10) using a CEE spin coater at a speed of 500 rpm. Next, the precursor is post-developed using an ultra violet exposure applied with a UVEXS/OM 91-04C tool using 1 pass at 1 foot per minute. At this point, MicroChem XP LOR 10B (polyimide based lift-off layer) is spin coated onto the device using a 20 second application with a CEE spin coater at a speed of 5000 rpm. The LOR is then baked by setting the substrate on a hotplate at 230° C. for five minutes. Next, photoresist (TOK OFPR 800-20) is spin coated onto the device using a CEE spin coater at a speed of 5000 rpm for 20 seconds. The photoresist is then baked on the hotplate at 230° C. for 1 minute. Next, another layer of precursor is spin coated onto the device using a CEE spin coater at a speed of 5000 rpm for 20 seconds. The precursor is exposed using an OAI deep ultraviolet contact aligner for a period of fifteen minutes with a power of 1.8 mJ/cm$^2$. Next the precursor is spin developed by a twenty second application of methyl isobutyl ketone:hexane:hexane (1:10) using a CEE spin coater at a speed of 500 rpm. Next, the precursor is post-developed using an ultra violet exposure applied with a UVEXS/OM 91-04C tool using 1 pass at 1 foot per minute. At this point the device is etched by reactive ion etching using a March Plasma CS1701 plasma etch tool with the following process parameters: total pressure=200 millitorr, power=500 watts, oxygen gas flow rate=75 seem, process time=70 to 700 seconds depending on film thickness. Finally, the LOR is selectively undercut with a 4:1 AZ 400K (positive photoresist developer) for twenty seconds to achieve the structure illustrated in FIG. 8.

Example 2

The following example illustrates the manufacture of the undercut pillar illustrated in FIG. 6. A MicroChem XP LOR 10B (polyimide based lift-off layer) is spin coated onto a silicon substrate using a CEE Model 100CB manual spin coater at a speed of 5000 rpm for a period of 20 seconds. The LOR is baked on a hotplate at 230° C. for five minutes. Then, TOK OFPR 800-20 is spin coated onto the device using a CEE spin coater at a speed of 5000 rpm for a period of 20 seconds. The photoresist is baked on a hotplate at a temperature of 230° C. for one minute before precursor is spin coated onto the device using a CEE spin coater at a speed of 5000 rpm for 20 seconds. The precursor is exposed using an OAI deep ultraviolet contact aligner for a period of fifteen minutes with a power of 1.8 mJ/cm$^2$. Next the precursor is spin developed by a twenty second application of methyl isobutyl ketone:hexane:hexane (1:10) using a CEE spin coater at a speed of 500 rpm. Next, the device is reactive ion etched using a March Plasma CS1701 plasma etch tool. Process parameters: total pressure=200 millitorr, power=500 watts, oxygen gas flow rate=75 sccm, process time=70 to 700 seconds depending on film thickness. The post-etch residue is removed using and the LOR is undercut with 4:1 AZ 400K (positive photoresist developer) for twenty seconds.

Example 3

This example provides a general process for photochemical metal organic deposition (PMOD)-based fabrication of permanent polymer structures such as those described in Sections I and II of the present invention. First, the photochemical metal organic precursor compound(s) are isolate, and purified as necessary. Any of the materials disclosed in Section III of the invention, for example, can be used. Next, the photochemical metal organic precursor formulation is prepared by dissolving the isolated (and possibly purified) metal-organic precursor compound(s) in solvents appropriate for coating. The substrate (or temporary substrate) is coated with a pattern-transfer layer. The pattern-transfer layer is a material that will become the permanent polymer structure. The solvate metal-organic precursor formulation is then overlayed on the pattern-transfer layer and selectively exposed to ultraviolet radiation (at ambient or elevated temperature) initiating a photochemical reaction whereby the organic ligands of the precursor are removed leaving substantially a metal oxide film. This exposure is performed in a patterned fashion, e.g. through a mask. The pattern is developed using developer formulation to remove the unconverted precursor material from the unexposed areas. Then post-photoconversion processing is applied as needed and as generally described in U.S. patent application Ser. No. 09/875,115 to Maloney et al., published as US 2002/0076495. The patterned metal oxide, pattern-transfer organic polymer coated substrate is then subjected to etching. Exemplary etching includes, but is not limited to an oxygen plasma, e.g. reactive ion etching, to remove the pattern-transfer organic polymer in the areas not protected by the metal-oxide hard mask. Post-etch residue and the patterned hard mask are then removed using cleaning formulation, if necessary

Example 4

Figure 9A:
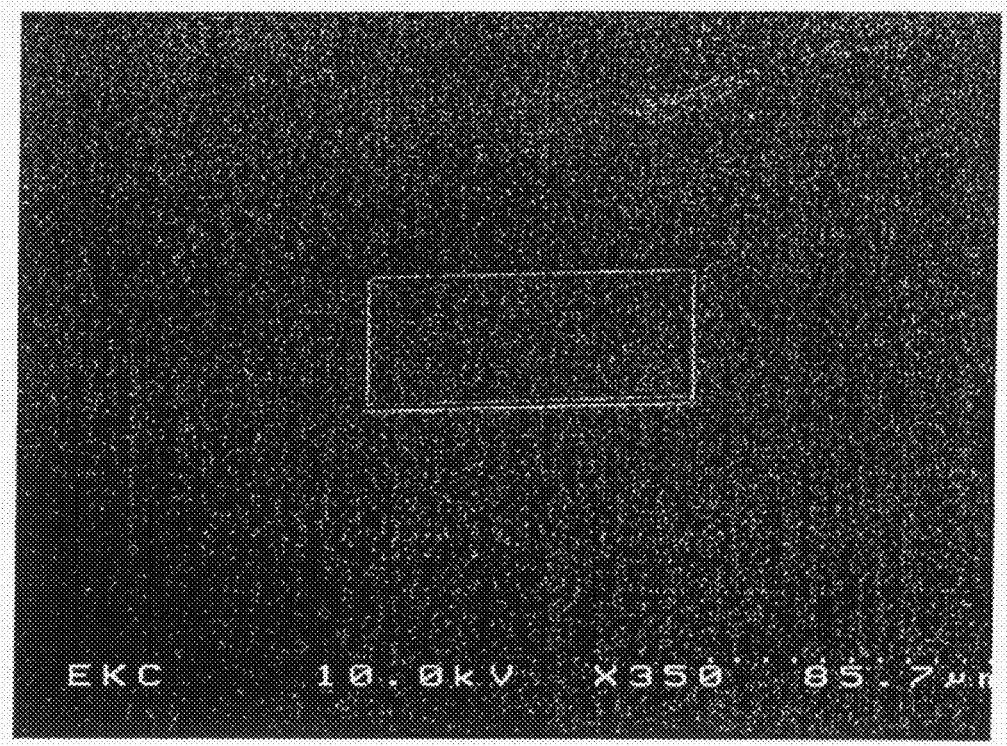
FIGS. 9a–9b illustrates the fabrication of polymer structures for OLED displays on plastic substrates.
Figure 9B:
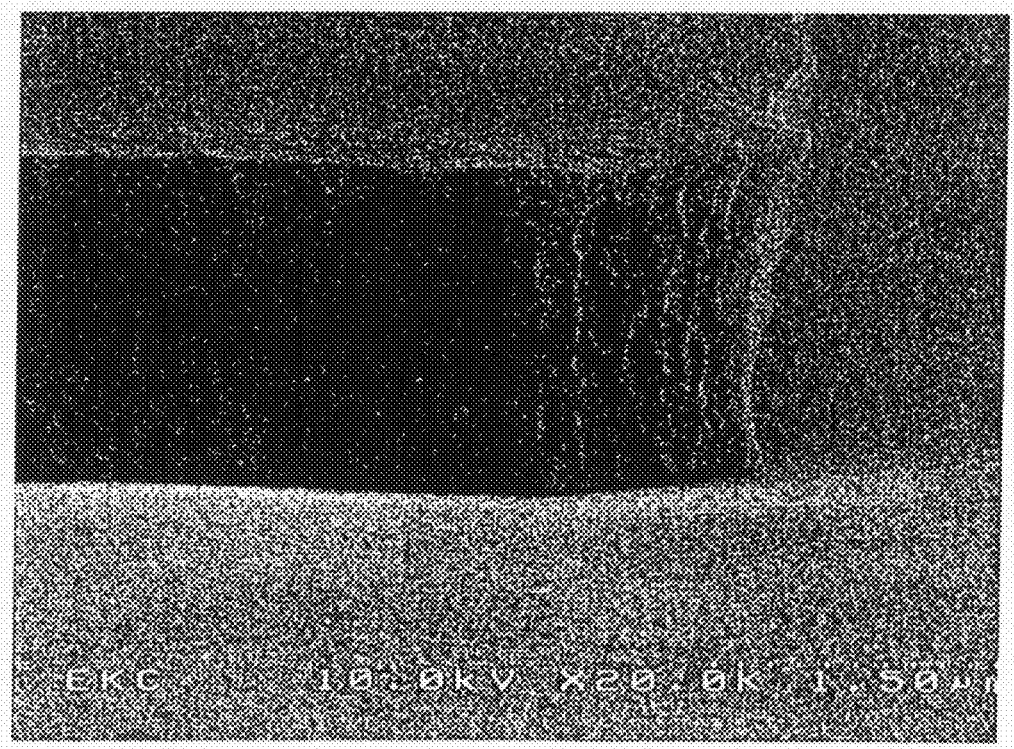

Prior examples used a silicon substrate. The following example illustrates that the techniques and methods of the present invention can be used on substrates other than silicon substrates as well. In the method, the devices illustrated in FIGS. 9A and 9B are fabricated. In the method, (Zr(2-ethylhexanoate)$_4$) (ZrOX PMOD) precursor was spin coated on a polyethylenenapthalate (PEN) substrate using a CEE Model 100CB manual spin coater at a speed of 5000 rpm for twenty seconds. The PMOD precursor was exposed using a UVEXS/OM 91-04C tool (1 pass at 1 ft/min). Then PMOD ZrOX was precursor was spin coated on the PEN substrate using a CEE spin coater (5000 rpm, 20 sec). The PMOD precursor was exposed using a UVEXS/OM 91-04C tool (1 pass at 1 ft/min). Next, PMOD ZrOX precursor was spin coated on the PEN using a CEE spin coater (5000 rpm, 20 sec). The PMOD precursor was exposed using a UVEXS/OM 91-04C tool (1 pass at 1 ft/min). Next, photoresist (JSR NFR 105G-95cP) was spin coated using a CEE spin coater (5000 rpm, 20 seconds). The photoresist was exposed using a UVEXS/OM 91-04C tool (2 passes at 1 ft/min). Next, PMOD TiOX precursor was spin coated using CEE spin coater (5000 rpm, 20 sec). The PMOD precursor was exposed using a OAI DUV contact aligner (15 min, 1.8 mJ/cm$^2$). The PMOD precursor was developed using a CEE spin coater in which MIBK: hexane (1:10) (500 rpm, 20 seconds) was applied. The device was then etch by RIE using a March Plasma CS1701 plasma etch tool with the following process parameters: total pressure=200 millitorr, power=500 watts, oxygen gas flow rate=75 seem, process time=120 seconds. Post-etch residue was removed using an post-etch remover in a semiaqueous formulation for 10 minutes. Then the device was rinsed with distilled water and dried with nitrogen gas.

V. Conclusion

All references cited herein are incorporated herein by reference in their entirety and for all purposes to the same extent as if each individual publication or patent or patent application was specifically and individually indicated to be incorporated by reference in its entirety for all purposes. While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of manufacturing a light emitting display having a transparent substrate wherein a first layer of transparent electrically conductive material is disposed on the transparent substrate forming a plurality of laterally spaced apart strips having a first direction, the method comprising:

depositing a first pattern transfer layer on said laterally spaced apart strips;

depositing a second pattern transfer layer on said first pattern transfer layer;

forming a precursor layer atop said second pattern transfer layer;

convening at least a portion of said precursor layer;

developing the precursor layer thereby forming a pattern in the precursor layer;

transferring the pattern in the precursor layer to said first pattern transfer layer and said second pattern transfer layer thereby exposing a portion of said transparent substrate;

etching said first pattern transfer layer so that said first pattern transfer layer undercuts said second pattern transfer layer;

depositing one or more organic materials on said second pattern transfer layer and said exposed portion of said transparent substrate; and depositing an upper layer of electrically conductive material on said one or more organic materials, thereby forming a plurality of spacedly disposed light emitting organic elements with the light emitting organic elements disposed in a second direction on the first layer of transparent electrically conductive material, wherein said first direction intersects said second direction.

2. The method of claim 1 wherein said first direction is orthogonal to said second direction.

3. The method of claim 1 wherein said first pattern transfer layer comprises a lift-off resist polyimide.

4. The method of claim 1 wherein said second pattern transfer layer comprises a polymer having a different etch property than an etch property of said first pattern transfer layer.

5. The method of claim 1 wherein said second pattern transfer layer is formed from an acrylic type resin, a styrene type resin, a novolac resin or a polyolefin type resin.

6. The method of claim 1 wherein said light emitting display is a passive matrix OLED-based display.

7. The method of claim 1 wherein said precursor layer is a metal complex comprising at least one ligand selected from the group consisting of acac, carboxylato, alkoxy, azide, carbonyl, nitrato, amine, halide, nitro, and mixtures thereof and at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof.

8. The method of claim 1, wherein said developing comprises developing away an unconverted portion of the precursor layer with a developer.

9. The method of claim 8, wherein the developer is a liquid developer comprising at least one alcohol and at least one ketone, wherein the total volume of all of the alcohols present is greater than 50% of the sum of the volumes of all of the alcohols present plus the volumes of all of the ketones present in the liquid developer.

10. The method of claim 9, wherein the at least one alcohol is isopropyl alcohol, the at least one ketone is methyl isobutyl ketone, and the ratio of isopropyl alcohol:methyl isobutyl ketone is from greater than about 1:1 by volume to less than about 40:1 by volume.

11. The method of claim 1, wherein said developing comprises developing away a converted portion of the precursor layer with a developer.

12. The method of claim 11, wherein the developer is a liquid developer comprising at least one alcohol and at least one ketone, wherein the total volume of all of the alcohols present is greater than 50% of the sum of the volumes of all of the alcohols present plus the volumes of all of the ketones present in the liquid developer.

13. The method of claim 12, wherein the at least one alcohol is isopropyl alcohol, the at least one ketone is methyl isobutyl ketone, and the ratio of isopropyl alcohol:methyl isobutyl ketone is from greater than about 1:1 by volume to less than about 40:1 by volume.

14. A method of manufacturing a color isolation well for a light emitting display having a transparent substrate with a surface, comprising:

(A) disposing a first well layer on the surface of the transparent substrate;

(B) forming a first precursor layer atop said first well layer;

(C) converting at least a portion of said first precursor layer;

(D) developing said first precursor layer thereby forming a first pattern in said first precursor layer, wherein said first pattern exposes a portion of said first well layer;

(E) disposing a second well layer on said first precursor layer and said portion of said first well layer that is exposed by said first pattern;

(F) forming a second precursor layer atop said second well layer;

(G) convening at least a portion of said second precursor layer;

(H) developing said second precursor layer thereby forming a second pattern in said second precursor layer, wherein said second pattern exposes a portion of said second well layer; and (I) transferring said second pattern in said second precursor layer to said second well layer and said first pattern in said first precursor layer to said first well layer thereby forming said color isolation well.

15. The method of claim 14 wherein said light emitting display comprises a passive matrix or active matrix OLED based display.

16. The method of claim 14 wherein a composition of said first well layer is determined by a property of said emissive polymer or small molecule dye.

17. The method of claim 16 wherein said property is hydrophobicity and both said emissive polymer or small molecule dye and said first well layer are hydrophobic.

18. The method claim 16 wherein said property is hydrophobicity and both said emissive polymer or small molecule dye and said first well layer are hydrophilic.

19. The method of claim 14 wherein a composition of said second well layer is determined by a property of said emissive polymer or small molecule dye.

20. The method of claim 19 wherein said property is hydrophobicity and said emissive polymer or small molecule dye is hydrophobic and said second well layer is hydrophilic.

21. The method of claim 19 wherein said property is hydrophobicity and said emissive polymer or small molecule dye is hydrophilic and said second well layer is hydrophobic.

22. The method of claim 14 wherein said first precursor layer that is formed in step (B) is a metal complex comprising at least one ligand selected from the group consisting of acac, carboxylato, alkoxy, azide, carbonyl, nitrato, amine, halide, nitro, and mixtures thereof and at least one metal selected from the group consisting of Li, Al, Si, Ti, V, Cr, Mn, Fe, Ni, Co, Cu, Zn, Sr, Y, Zr, Nb, Mo, Ru, Rh, Pd, Ag, In, Sn, Ba, La, Pr, Sm, Eu, Hf, Ta, W, Re, Os, Ir, Pt, Au, Pb, Th, U, Sb, As, Ce, Mg, and mixtures thereof.

23. The method of claim 14 wherein said developing step (D) comprises applying a liquid developer to said first precursor layer, said liquid developer comprising at least one alcohol and at least one ketone, wherein the total volume of all of the alcohols present is greater than 50% of the sum of the volumes of all of the alcohols present plus the volumes of all of the ketones present in the liquid developer.

24. The method of claim 23, wherein the at least one alcohol is isopropyl alcohol, the at least one ketone is methyl isobutyl ketone, and the ratio of isopropyl alcohol:methyl isobutyl ketone is from greater than about 1:1 by volume to less than about 40:1 by volume.

25. The method of claim 14, wherein said developing step (H) comprises applying a liquid developer to said first precursor layer, said liquid developer comprising at least one alcohol and at least one ketone, wherein the total volume of all of the alcohols present is greater than 50% of the sum of the volumes of all of the alcohols present plus the volumes of all of the ketones present in the liquid developer.

26. The method of claim 25, wherein the at least one alcohol is isopropyl alcohol, the at least one ketone is methyl isobutyl ketone, and the ratio of isopropyl alcohol:methyl isobutyl ketone is from greater than about 1:1 by volume to less than about 40:1 by volume.

27. The method of claim 14 wherein said transferring step (I) comprises reactive ion etching.

28. The method of claim 1 wherein said etching said first pattern transfer layer so that said first pattern transfer layer undercuts said second pattern transfer layer comprises spray etching, wet etching, vapor etching, or plasma etching said first pattern transfer layer.

29. A method of manufacturing a light emitting display having a transparent substrate wherein a first layer of transparent electrically conductive material is disposed on the transparent substrate forming a plurality of spaced apart strips having a first direction, the method comprising:

depositing a first pattern transfer layer on said laterally spaced apart strips;

forming a precursor layer atop said first pattern transfer layer;

converting at least a portion of said precursor layer;

developing the precursor layer thereby forming a pattern in the precursor layer;

transferring the pattern in the precursor layer to said first pattern transfer layer;

etching said first pattern transfer layer so that said first pattern transfer layer undercuts said precursor layer;

depositing one or more organic materials on said precursor layer; and depositing an upper layer of electrically conductive material on said one or more organic materials, thereby forming a plurality of spacedly disposed light emitting organic elements with the light emitting organic elements disposed in a second direction on the first layer of transparent electrically conductive material, wherein said first direction intersects said second direction.

30. A photoresist-free method of manufacturing a color isolation well for a light emitting display having a transparent substrate with a surface, comprising:

(A) disposing a well layer on the surface of the transparent substrate;

(B) forming a precursor layer atop said first well layer;

(C) converting at least a portion of said precursor layer;

(D) developing said precursor layer thereby forming a pattern in said precursor layer, wherein said pattern exposes a portion of said well layer; and (E) transferring said pattern in said precursor layer to said well layer thereby forming said color isolation well, wherein said pattern is formed without the use of a photoresist.

* * * * *